(12) United States Patent
Bunyk et al.

(10) Patent No.: US 8,786,476 B2
(45) Date of Patent: Jul. 22, 2014

(54) SYSTEMS, METHODS AND APPARATUS FOR DIGITAL-TO-ANALOG CONVERSION OF SUPERCONDUCTING MAGNETIC FLUX SIGNALS

(75) Inventors: Paul I. Bunyk, Vancouver (CA); Felix Maibaum, Vancouver (CA); Andrew J. Berkley, Vancouver (CA); Thomas Mahon, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 294 days.

(21) Appl. No.: 13/325,785

(22) Filed: Dec. 14, 2011

(65) Prior Publication Data

US 2012/0094838 A1   Apr. 19, 2012

Related U.S. Application Data

(62) Division of application No. 12/120,354, filed on May 14, 2008, now Pat. No. 8,098,179.

(60) Provisional application No. 60/917,884, filed on May 14, 2007, provisional application No. 60/917,891, filed on May 14, 2007, provisional application No. 60/975,487, filed on Sep. 26, 2007.

(51) Int. Cl.
*H03M 1/00*   (2006.01)

(52) U.S. Cl.
USPC ............. 341/133; 709/238; 712/37; 505/170; 505/190; 257/31; 257/36

(58) Field of Classification Search
USPC ..................... 341/130–160; 709/238; 712/37; 505/170, 190; 257/31, 36, E39.014
See application file for complete search history.

(56) References Cited

U.S. PATENT DOCUMENTS

| | | | |
|---|---|---|---|
| 4,956,642 A | 9/1990 | Harada | 341/133 |
| 4,983,971 A | 1/1991 | Przybysz et al. | 341/133 |
| 5,128,675 A | 7/1992 | Harada | 341/133 |
| 5,162,731 A | 11/1992 | Fujimaki | 324/248 |
| 5,398,030 A | 3/1995 | Sandell | 341/133 |
| 5,936,458 A | 8/1999 | Rylov | 327/528 |
| 6,838,694 B2 | 1/2005 | Esteve et al. | 257/34 |
| 7,129,870 B2 | 10/2006 | Hirano et al. | 341/133 |
| 7,268,713 B2 | 9/2007 | Suzuki et al. | 341/133 |
| 7,335,909 B2 | 2/2008 | Amin et al. | 257/34 |

(Continued)

OTHER PUBLICATIONS

U.S. Appl. No. 11/950,276, filed Dec. 4, 2007, Berkley et al.

(Continued)

*Primary Examiner* — Lam T Mai
(74) *Attorney, Agent, or Firm* — Seed IP Law Group PLLC

(57) ABSTRACT

A superconducting flux digital-to-analog converter includes a superconducting inductor ladder circuit. The ladder circuit includes a plurality of closed superconducting current paths that each includes at least two superconducting inductors coupled in series to form a respective superconducting loop, successively adjacent or neighboring superconducting loops are connected in parallel with each other and share at least one of the superconducting inductors to form a flux divider network. A data signal input structure provides a respective bit of a multiple bit signal to each of the superconducting loops. The data signal input structure may include a set of superconducting quantum interference devices (SQUIDs). The data signal input structure may include a superconducting shift register, for example a single-flux quantum (SFQ) shift register or a flux-based superconducting shift register comprising a number of latching qubits.

19 Claims, 14 Drawing Sheets

(56) References Cited

U.S. PATENT DOCUMENTS

| | | | |
|---|---|---|---|
| 7,365,663 B2 | 4/2008 | Rylov et al. | 341/133 |
| 7,733,253 B2 | 6/2010 | Kirichenko | 341/133 |
| 7,800,395 B2 | 9/2010 | Johnson et al. | 326/3 |
| 7,876,248 B2 | 1/2011 | Berkley et al. | 341/133 |
| 8,073,808 B2* | 12/2011 | Rose | 706/62 |
| 8,098,179 B2* | 1/2012 | Bunyk et al. | 341/133 |
| 8,159,313 B2* | 4/2012 | Uchaykin | 333/185 |
| 8,169,231 B2* | 5/2012 | Berkley | 326/4 |
| 8,179,133 B1* | 5/2012 | Kornev et al. | 324/248 |
| 8,228,688 B2* | 7/2012 | Uchaykin et al. | 361/818 |
| 8,244,650 B2* | 8/2012 | Rose | 706/13 |
| 8,247,799 B2* | 8/2012 | Bunyk et al. | 257/31 |
| 8,405,468 B2* | 3/2013 | Uchaykin | 333/99 S |
| 8,441,329 B2* | 5/2013 | Thom et al. | 333/202 |
| 2006/0147154 A1 | 7/2006 | Thom et al. | 385/37 |
| 2006/0225165 A1 | 10/2006 | Maassen van den Brink et al. | 977/933 |
| 2007/0052441 A1 | 3/2007 | Taguchi et al. | 326/3 |
| 2008/0176750 A1 | 7/2008 | Rose et al. | 505/170 |
| 2008/0215850 A1 | 9/2008 | Berkley et al. | 712/1 |
| 2008/0238531 A1 | 10/2008 | Harris | 327/528 |
| 2009/0075825 A1* | 3/2009 | Rose et al. | 505/170 |
| 2011/0094838 A1* | 4/2011 | Haack | 188/325 |
| 2011/0175061 A1* | 7/2011 | Berkley et al. | 257/31 |

OTHER PUBLICATIONS

U.S. Appl. No. 12/013,192, filed Jan. 11, 2008, Rose et al.
U.S. Appl. No. 12/017,995, filed Jan. 22, 2008, Harris.
Blatter et al., "Design aspects of superconducting-phase quantum bits," *Physical Review B 63*: 174511-1-174511-9, 2001.
Bunyk et al., "RSFQ Technology: Physics and Devices," *International Journal of High Speed Electronics and Systems 11*(1):257-305, 2001.
Farhi et al., "Quantum Adiabatic Evolution Algorithms versus Simulated Annealing," MIT-CTP #3228, arXiv:quant-ph/0201031 v1, pp. 1-16, Jan. 8, 2002.
Feynman, "Simulating Physics with Computers," *International Journal of Theoretical Physics 21*(6/7): 467-488, 1982.
Friedman et al., "Quantum superposition of distinct macroscopic states," *Nature 406*: 43-46, Jul. 6, 2000.
Il'ichev et al., "Continuous Monitoring of Rabi Oscillations in a Josephson Flux Qubit," *Physical Review Letters 91*(9): 097906-1-097906-4, week ending Aug. 29, 2003.
U.S. Appl. 12/109,847, filed Apr. 25, 2008, Berkley.
U.S. Appl. No. 60/917,884, filed May 14, 2007, Berkley et al.
U.S. Appl. No. 60/917,891, filed May 14, 2007, Bunyk et al.
U.S. Appl. No. 60/975,487, filed Sep. 26, 2007, Maibaum et al.
U.S. Appl. No. 60/986,554, filed Nov. 8, 2007, Choi.
U.S. Appl. No. 61/039,710, filed Mar. 26, 2008, Maibaum et al.
Likharev, "Dynamics of Some Single Flux Quantum Devices: I. Parametric Quatron," *IEEE Transactions on Magnetics MAG-13*(1):242-244, 1977.
Likharev, "Classical and Quantum Limitations on Energy Consumption in Computation," *International Journal of Theoretical Physics 21*(3/4):311-326, 1982.
Likharev, "Reversible Conveyer Computation in Array of Parametric Quantrons," *IEEE Transactions on Magnetics MAG-21*(2):947-950, 1985.
Likharev et al., "RSFQ Logic/Memory Family: A New Josephson-Junction Technology for Sub-Terahertz-Clock-Frequency Digital Systems," *IEEE Transactions on Applied Superconductivity 1*(1):3-28, 1991.
Makhlin et al., "Quantum-state engineering with Josephson-junction devices," *Reviews of Modern Physics 73*(2): 357-400, Apr. 2001.

\* cited by examiner

SYSTEMS, METHODS AND APPARATUS FOR DIGITAL-TO-ANALOG CONVERSION OF SUPERCONDUCTING MAGNETIC FLUX SIGNALS

CROSS REFERENCE TO RELATED APPLICATIONS

This application is a division of U.S. patent application Ser. No. 12/120,354, filed May 14, 2008, now pending, which claims benefit under 35 U.S.C. 119(e) of U.S. Provisional Patent Application Ser. No. 60/917,884, filed May 14, 2007, entitled "Scalable Superconducting Flux Digital-To-Analog Conversion Using A Superconducting Inductor Ladder Circuit", U.S. Provisional Patent Application Ser. No. 60/917,891, filed May 14, 2007, entitled "Systems, Methods, And Apparatus For A Scalable Superconducting Flux Digital-To-Analog Converter", and U.S. Provisional Patent Application Ser. No. 60/975,487, filed Sep. 26, 2007, entitled "Systems, Methods and Apparatus for a Differential Superconducting Flux Digital-to-Analog Converter", which are incorporated herein by reference in their entirety.

BACKGROUND

1. Field

The present systems, methods, and apparatus generally relate to superconducting circuits and digital-to-analog conversion of superconducting signals, and particularly relate to scalable quantum computing and the programming of elements of a superconducting quantum processor.

2. Description of the Related Art

A Turing machine is a theoretical computing system, described in 1936 by Alan Turing. A Turing machine that can efficiently simulate any other Turing machine is called a Universal Turing Machine (UTM). The Church-Turing thesis states that any practical computing model has either the equivalent or a subset of the capabilities of a UTM.

A quantum computer is any physical system that harnesses one or more quantum effects to perform a computation. A quantum computer that can efficiently simulate any other quantum computer is called a Universal Quantum Computer (UQC).

In 1981 Richard P. Feynman proposed that quantum computers could be used to solve certain computational problems more efficiently than a UTM and therefore invalidate the Church-Turing thesis. See e.g., Feynman R. P., "Simulating Physics with Computers", International Journal of Theoretical Physics, Vol. 21 (1982) pp. 467-488. For example, Feynman noted that a quantum computer could be used to simulate certain other quantum systems, allowing exponentially faster calculation of certain properties of the simulated quantum system than is possible using a UTM.

Approaches to Quantum Computation

There are several general approaches to the design and operation of quantum computers. One such approach is the "circuit model" of quantum computation. In this approach, qubits are acted upon by sequences of logical gates that are the compiled representation of an algorithm. Circuit model quantum computers have several serious barriers to practical implementation. In the circuit model, it is required that qubits remain coherent over time periods much longer than the single-gate time. This requirement arises because circuit model quantum computers require operations that are collectively called quantum error correction in order to operate. Quantum error correction cannot be performed without the circuit model quantum computer's qubits being capable of maintaining quantum coherence over time periods on the order of 1,000 times the single-gate time. Much research has been focused on developing qubits with coherence sufficient to form the basic information units of circuit model quantum computers. See e.g., Shor, P. W. "Introduction to Quantum Algorithms", arXiv.org:quant-ph/0005003 (2001), pp. 1-27. The art is still hampered by an inability to increase the coherence of qubits to acceptable levels for designing and operating practical circuit model quantum computers.

Another approach to quantum computation involves using the natural physical evolution of a system of coupled quantum systems as a computational system. This approach does not make critical use of quantum gates and circuits. Instead, starting from a known initial Hamiltonian, it relies upon the guided physical evolution of a system of coupled quantum systems wherein the problem to be solved has been encoded in the terms of the system's Hamiltonian, so that the final state of the system of coupled quantum systems contains information relating to the answer to the problem to be solved. This approach does not require long qubit coherence times. Examples of this type of approach include adiabatic quantum computation, cluster-state quantum computation, one-way quantum computation, quantum annealing and classical annealing, and are described, for example, in Farhi, E. et al., "Quantum Adiabatic Evolution Algorithms versus Simulated Annealing" arXiv.org:quant-ph/0201031 (2002), pp 1-16.

Qubits

As mentioned previously, qubits can be used as fundamental units of information for a quantum computer. As with bits in UTMs, qubits can refer to at least two distinct quantities; a qubit can refer to the actual physical device in which information is stored, and it can also refer to the unit of information itself, abstracted away from its physical device. Examples of qubits include quantum particles, atoms, electrons, photons, ions, and the like.

Qubits generalize the concept of a classical digital bit. A classical information storage device can encode two discrete states, typically labeled "0" and "1". Physically these two discrete states are represented by two different and distinguishable physical states of the classical information storage device, such as direction or magnitude of magnetic field, current, or voltage, where the quantity encoding the bit state behaves according to the laws of classical physics. A qubit also contains two discrete physical states, which can also be labeled "0" and "1". Physically these two discrete states are represented by two different and distinguishable physical states of the quantum information storage device, such as direction or magnitude of magnetic field, current, or voltage, where the quantity encoding the bit state behaves according to the laws of quantum physics. If the physical quantity that stores these states behaves quantum mechanically, the device can additionally be placed in a superposition of 0 and 1. That is, the qubit can exist in both a "0" and "1" state at the same time, and so can perform a computation on both states simultaneously. In general, N qubits can be in a superposition of $2^N$ states. Quantum algorithms make use of the superposition property to speed up some computations.

In standard notation, the basis states of a qubit are referred to as the $|0\rangle$ and $|1\rangle$ states. During quantum computation, the state of a qubit, in general, is a superposition of basis states so that the qubit has a nonzero probability of occupying the $|0\rangle$ basis state and a simultaneous nonzero probability of occupying the $|1\rangle$ basis state. Mathematically, a superposition of basis states means that the overall state of the qubit, which is denoted $|\Psi\rangle$, has the form $|\Psi\rangle = a|0\rangle + b|1\rangle$, where a and b are coefficients corresponding to the probabilities $|a|^2$ and $|b|^2$, respectively. The coefficients a and b each have real and imaginary components, which allows the phase of the qubit to be characterized. The quantum nature of a qubit is largely derived from its ability to exist in a coherent superposition of basis states and for the state of the qubit to have a phase. A qubit will retain this ability to exist as a coherent superposition of basis states when the qubit is sufficiently isolated from sources of decoherence.

To complete a computation using a qubit, the state of the qubit is measured (i.e., read out). Typically, when a measurement of the qubit is performed, the quantum nature of the qubit is temporarily lost and the superposition of basis states collapses to either the $|0\rangle$ basis state or the $|1\rangle$ basis state and thus regaining its similarity to a conventional bit. The actual state of the qubit after it has collapsed depends on the probabilities $|a|^2$ and $|b|^2$ immediately prior to the readout operation.

Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Typical superconducting qubits, for example, have the advantage of scalability and are generally classified depending on the physical properties used to encode information including, for example, charge and phase devices, phase or flux devices, hybrid devices, and the like. Superconducting qubits can be separated into several categories depending on the physical property used to encode information. For example, they may be separated into charge, flux and phase devices, as discussed in, for example Makhlin et al., 2001, *Reviews of Modern Physics* 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See e.g., Nielsen and Chuang, *Quantum Computation and Quantum Information*, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. No. 6,838,694 and U.S. Pat. No. 7,335,909.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See e.g., Mooij et al., 1999, *Science* 285, 1036; and Orlando et al., 1999, *Phys. Rev.* B 60, 15398. Other examples of superconducting qubits can be found, for example, in Il'ichev et al., 2003, *Phys. Rev. Lett.* 91, 097906; Blatter et al., 2001, *Phys. Rev. B* 63, 174511, and Friedman et al., 2000, *Nature* 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. The dc-SQUID magnetometers including a loop of superconducting material interrupted by at least one Josephson junction are well known in the art.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, U.S. patent application Ser. No. 12/013,192, U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. patent application Ser. No. 12/017,995. Respective coupling strengths of the coupling devices may be tuned between zero and a maximum value, for example, to provide ferromagnetic or anti-ferromagnetic coupling between qubits.

Regardless of the specific hardware being implemented, managing a single qubit requires control over a number of parameters. Conventionally, this requirement necessitated outside communication (that is, communication from outside of the processor architecture) with individual qubits. However, since overall processing power increases with the number of qubits in the system, high capacity processors that exceed the abilities of conventional supercomputers must manage a large number of qubits and thus the conventional approach of employing outside control over multiple parameters on individual qubits requires a complicated system for programming qubit parameters.

Thus, the scalability of quantum processors is limited by the complexity of the qubit parameter control system and there remains a need in the art for a scalable qubit parameter control system.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

BRIEF SUMMARY

One aspect may be summarized as a superconducting inductor ladder circuit that includes a first closed superconducting current path that includes at least two superconducting inductors coupled in series with each other along the first closed superconducting current path to form a first superconducting loop; at least a second closed superconducting current path that includes at least two superconducting inductors coupled in series with each other along the second closed superconducting current path to form a second superconducting loop, wherein the first and the second superconducting loops are connected in parallel with each other such that there is a portion of the first and the second closed superconducting current paths that includes at least one of the superconducting inductors that is shared by the first and the second superconducting loops, and at least one of the superconducting inductors of the first superconducting loop is not shared with the second superconducting loop and at least one of the superconducting inductors of the second superconducting loop is not shared with the first superconducting loop; a data signal input structure configured to couple data signals to at least one of the unshared superconducting inductors in each of at least the first and the second superconducting loops; and a data signal output structure configured to couple data signals from at least one of the first and second superconducting loops. The data signal input structure may include at least two superconducting inductors, each positioned sufficiently proximate at least one of the unshared superconducting inductors in a respective one of the superconducting loops to inductively couple the data signals thereto. The data signal input structure may be configured to administer a signal with a resolution of at least two bits such that a first signal bit is loaded into the first superconducting loop and a second signal bit is loaded into the second superconducting loop. The superconducting inductor ladder circuit may include at least one additional closed superconducting current path that includes at least two superconducting inductors coupled in series with each other along the third closed superconducting current paths to form additional superconducting loops connected in parallel with one another such that successive ones of the additional superconducting loops share at least one of the superconducting inductors with an immediately preceding one of the additional superconducting loops, and wherein the data signal input structure is further configured to couple data signals to at least one superconducting inductor of each of the additional superconducting loops. The data signal input structure may include a superconducting shift register, for example a single-flux quantum (SFQ) shift register or a flux-based superconducting shift register comprising latching qubits.

Another aspect may be summarized as a method of performing digital-to-analog conversion of a superconducting signal that includes establishing a digital signal represented by magnetic flux quanta; loading a number of individual bits of the digital signal into respective ones of a number of superconducting loops of a superconducting inductor ladder circuit; and allowing the individual bits of the digital signal to combine into one combined analog signal within the superconducting inductor ladder circuit according to a ratio of the magnitudes of a number of shared superconducting inductors and a number of unshared superconducting inductors. Loading a number of individual bits of the digital signal into respective ones of a number of superconducting loops of a superconducting inductor ladder circuit may include loading the individual bits of the digital signal into the superconducting inductor ladder circuit from individual signal lines that are inductively coupled to the respective ones of the superconducting loops of the superconducting inductor ladder circuit. Loading a number of individual bits of the digital signal into respective ones of a number of superconducting loops of a superconducting inductor ladder circuit may include loading the individual bits of the digital signal into the superconducting inductor ladder circuit from a superconducting shift register, for example, a single-flux quantum (SFQ) shift register or a flux-based superconducting shift register comprising latching qubits.

Another aspect may be summarized as a superconductive inductor ladder circuit that includes a plurality of input devices superconductively coupled in series with each other; an output device; and a superconductive inductor flux divider network superconductively coupled to provide a successively attenuated flux signal to the output device from each of the input devices in relation to a relative proximity of the respective input device to the output device with respect to the other ones of the input devices. The plurality of input devices superconductively coupled in series with each other may include a number N of input devices and wherein the superconductive inductor flux divider network includes a number N−1 of superconductive inductors, each of the N−1 superconductive inductors having a first node and a second node, the first node of each of the N−1 superconductive inductors coupled between a respective pair of the N input devices and a second node of the N−1 superconductive inductors commonly coupled to each other such that the N−1 superconductive inductors are superconductively coupled in parallel with each other. The superconductive inductor flux divider network may further include a last superconductive inductor having a first node and a second node, the first node of the last superconductive inductor coupled in series to the first node of one of the N−1 superconductive inductors and the second node of the last superconductive inductor commonly coupled to the second node of each of the N−1 superconductive inductors such that the last superconductive inductor is superconductively coupled in parallel with each of the N−1 superconductive inductors. The output device may be a superconductive inductor, superconductively coupled in parallel with the N−1 superconductive inductors and with the last superconductive inductor. The input devices may each be a respective superconductive inductor. A ratio of inductance between the N−1 superconductive inductors and the input devices may be approximately 2:1.

One aspect may be summarized as a superconducting flux digital-to-analog converter (DAC) that includes N superconducting quantum interference devices (SQUIDs), each of the N SQUIDs including at least one Josephson junction, wherein N is a positive integer; N superconducting inductors, each of the N superconducting inductors superconductingly coupled in parallel with the at least one Josephson junction of a respective one of the SQUIDs, and each of the N superconducting inductors superconductingly coupled in parallel with one another; a gate current line that superconductingly connects each of the N SQUIDs in series with one another; a data signal input structure configured to load at least one digital bit of information into a respective one of each of the N SQUIDs; and a data signal output structure configured to couple at least one analog signal to at least one programmable device.

Another aspect may be summarized as a superconducting flux digital-to-analog converter (DAC) that includes a sets of N superconducting quantum interference devices (SQUIDs) wherein each SQUID includes at least one Josephson junction, and wherein a and N are both positive integers; a sets of N superconducting inductors wherein each superconducting inductor is superconductingly coupled in parallel with the at least one Josephson junction of a respective one of the SQUIDs, and wherein each of the N superconducting inductors in respective ones of the a sets of N superconducting inductors are superconductingly coupled in parallel with one another; a gate current line that superconductingly connects each of the N SQUIDs in series with one another; a data signal input structure configured to load at least one digital bit of information into a respective one of each of the N SQUIDs; and a data signal output structure configured to couple at least one analog signal to at least one programmable device.

In either aspect, a and/or N may be greater than one. In either aspect, the SQUIDs may be arranged in an a by N array to form an arrayal weighted superconducting flux DAC, and the a sets of N parallel-coupled superconducting inductors form a respective set of a parallel networks of superconducting loops in which the inductances of the superconducting inductors are selected such that flux quanta administered to each parallel network of superconducting loops are combined in weighted measures within each parallel network of superconducting loops according to the respective SQUID from whence each flux quantum originated, and wherein the weighting depends on a ratio $k_x$ of the inductances of successively adjacent superconducting inductors in each parallel network of superconducting loops. The at least one programmable device may be an element of a superconducting quantum processor. The data signal output structure may include at least one superconducting inductor that employs at least one of inductive coupling, capacitive coupling, or galvanic coupling. The data signal output structure may include intermediate coupling devices, which may be activated and deactivated via coupling control signal lines. In some embodiments two or more intermediate coupling devices may be controlled via a same control signal line. The data signal input structure may include N control current signal lines, at least one control current signal line is inductively coupled to a respective one of the N SQUIDs. The data signal input structure may include N control current signal lines, at least one control current signal line is inductively coupled to a respective one of the N SQUIDs in each of the a sets of N SQUIDs such that at least a SQUIDs are inductively coupled to each one of the N control current signal lines. The data signal input structure may include at least one superconducting shift register and data signals are loaded from the at least one superconducting shift register to each SQUID by inductive coupling. The at least one superconducting shift register may be a single flux quantum (SFQ) shift register or a flux-based superconducting shift register comprised of latching qubits. The data signal input structure is configured to load at least one N-bit digital signal into the superconducting flux DAC such that respective ones of each of the N bits are each loaded into a respective SQUID.

In either aspect, the inductance and critical current of each SQUID is may be selected such that each SQUID is capable of managing a number n of magnetic flux quanta according to the relationship $$n = \frac{LI_c}{\Phi_o},$$

where L is the SQUID inductance, $I_c$ is the Josephson junction critical current, $\phi_0$ is the magnetic flux quantum and n≥1. A maximum signal resolution may be administered by selecting the inductances of the superconducting inductors such that each unique digital input signal corresponds to a unique analog output signal. The inductances of successively adjacent superconducting inductors within a parallel network of superconducting loops may be such that less than one full flux quantum is always transferred to an adjacent superconducting inductor. The ratio of the inductances, $k_x$, between successively adjacent superconducting inductors in a parallel network of superconducting loops may be $$k_x < \frac{\Phi_o}{LI_c}$$

where L is the SQUID inductance, $I_c$ is the Josephson junction critical current, and $\phi_0$ is the magnetic flux quantum.

Yet another aspect may be summarized as a method of programming the elements of a superconducting programmable device including encoding the programming of the desired elements in at least one N-bit digital signal; physically realizing the digital signal in the form of discrete magnetic flux quanta; administering the discrete magnetic flux quanta to parallel storage devices; combining the discrete magnetic flux quanta into a calibrated analog signal, wherein the contribution of each magnetic flux quantum is weighted according to the parallel storage device from whence it originated; and administering the calibrated analog signal to a programmable element of the superconducting programmable device.

At least one embodiment may be summarized as a superconducting flux digital-to-analog converter (DAC) including a number of N superconducting quantum interference devices (SQUIDs), each of the N SQUIDs respectively including at least a first Josephson junction and a second Josephson junction, wherein N is a positive integer; a first set of N superconducting transformers, each of the superconducting transformers in the first set of N superconducting transformers comprises at least a first superconducting inductor and second superconducting inductor positioned sufficiently proximate one another to couple signals therebetween, and wherein the first superconducting inductor in a respective one of each of the first set of N superconducting transformers is superconductingly coupled in parallel with the first Josephson junction in a respective SQUID; a second set of N superconducting transformers, each of the superconducting transformers in the second set of N superconducting transformers comprising at least a first superconducting inductor and a second superconducting inductor positioned sufficiently proximate one another to couple signals therebetween, wherein the first superconducting inductor in a respective one of each of the second set of N superconducting transformers is superconductingly coupled in parallel with the second Josephson junction in a respective SQUID; a first superconducting inductor ladder circuit formed by a first set of N closed superconducting current paths, wherein each respective closed superconducting current path in the first superconducting inductor ladder circuit includes at least two superconducting inductors coupled in series with each other along the respective closed superconducting current path, and wherein one of the at least two superconducting inductors in each of the first set of N closed superconducting current paths is the second superconducting inductor from a respective one of the superconducting transformers in the first set of N superconducting transformers, and wherein the first set of N closed superconducting current paths are connected in parallel with one another such that each pair of successive closed superconducting current paths in the first superconducting inductor ladder circuit shares at least one superconducting inductor; a second superconducting inductor ladder circuit formed by a second set of N closed superconducting current paths, wherein each respective closed superconducting current path in the second superconducting inductor ladder circuit includes at least two superconducting inductors coupled in series with each other along the respective closed superconducting current path, and wherein one of the at least two superconducting inductors in each of the second set of N closed superconducting current paths is the second superconducting inductor from a respective one of the superconducting transformers in the second set of N superconducting transformers, and wherein the second set of N closed superconducting current paths are connected in parallel with one another such that each pair of successive closed superconducting current paths in the second superconducting inductor ladder circuit shares at least one superconducting inductor; a column current line that superconductingly connects each of the N SQUIDs in series with one another; a first data signal input structure configured to load at least one digital bit of information into a respective one of each of the N SQUIDs; and a data signal output structure configured to couple at least one analog signal to at least one programmable device.

The data signal output structure may include a gradiometric transformer that is inductively coupled to at least one of the superconducting inductors in both the first and the second superconducting inductor ladder circuits. The superconducting flux DAC may further include a second data signal input structure configured to load at least one digital bit of information into each of the N SQUIDs. The first data signal input structure may include N signal lines, each of the N SQUIDs coupled to a respective one of the N signal lines of the first data signal input structure, and the second data signal input structure may include a signal line, all of the N SQUIDs coupled to the signal line of the second data signal input structure.

At least one embodiment may be summarized as a superconducting flux digital-to-analog conversion system including a number a of superconducting flux DACs, wherein each superconducting flux DAC comprises: a number N of superconducting quantum interference devices (SQUIDs), each of the SQUIDs including at least a first Josephson junction and a second Josephson junction, wherein N is a positive integer; a first set of N superconducting transformers, each of the superconducting transformers in the first set of superconducting transformers comprises at least a first superconducting inductor and a second superconducting inductor positioned sufficiently proximate one another to couple signals therebetween, and wherein the first superconducting inductor in a respective one of each of the first set of N superconducting transformers is superconductingly coupled in parallel with the first Josephson junction in a respective one of the SQUIDs; a second set of N superconducting transformers, each of the superconducting transformers in the second set of superconducting transformers comprising at least a first superconducting inductor and a second superconducting inductor positioned sufficiently proximate one another to couple signals therebetween, wherein the first superconducting inductor in a respective one of each of the second N superconducting transformers is superconductingly coupled in parallel with the second Josephson junction in a respective one of the SQUIDs; a first superconducting inductor ladder circuit formed by a first set of N closed superconducting current paths, wherein each respective closed superconducting current path in the first superconducting inductor ladder circuit includes at least two superconducting inductors coupled in series with each other along the respective closed superconducting current path, and wherein one of the at least two superconducting inductors in each of the first set of N closed superconducting current paths is the second superconducting inductor from a respective superconducting transformer in the first set of N superconducting transformers, and wherein the first set of N closed superconducting current paths are connected in parallel with one another such that each pair of successive closed superconducting current paths shares at least one superconducting inductor; a second superconducting inductor ladder circuit formed by a second set of N closed superconducting current paths, wherein each respective closed superconducting current path in the second superconducting inductor ladder circuit includes at least two superconducting inductors coupled in series with each other along the respective closed superconducting current path, and wherein one of the at least two superconducting inductors in each of the second set of N closed superconducting current paths is the second superconducting inductor from a respective superconducting transformer in the second set of N superconducting transformers, and wherein the second set of N closed superconducting current paths are connected in parallel with one another such that each pair of successive closed superconducting current paths shares at least one superconducting inductor; a first column current line that superconductingly connects each of the N SQUIDs in series with one another; a first set of data signal input lines each configured to load at least one digital bit of information into a respective one of each of the N SQUIDs; a second set of data signal input lines configured to load at least one digital bit of information into each of the N SQUIDs; and a data signal output structure configured to couple at least one analog signal to at least one programmable device, wherein respective ones of at least some of the SQUIDS from each of the DACs that occupy a same position in the respective DAC relative to the other SQUIDS in the respective DAC are coupled to receive the at least one digital bit of information via a same one of the data signal input lines of the first set of data signal input lines, and wherein for each of the DACs at least two of the SQUIDS in the respective DAC are coupled to receive the at least one digital bit of information via a same one of the data signal input lines of the second set of data signal input lines.

At least one of the N SQUIDs in respective ones of at least two of the a superconducting flux DACs may be coupled to receive the at least one digital bit of information via a same one of the data signal input lines of the second set of data signal input lines. At least one of the N SQUIDs in respective ones of at least two of the a superconducting flux DACs may be coupled to be at least partially controlled via the first column current line. Each data signal output structure may include a gradiometric transformer that is inductively coupled to at least one of the superconducting inductors in both the first and the second superconducting inductor ladder circuits. The at least one programmable device may be an element of a superconducting processor. The superconducting processor may be a superconducting quantum processor. The data signal output structure may include at least one intermediate coupling device. The at least one intermediate coupling device may be inductively coupled to both a programmable device and a superconducting inductor in the data signal output structure, and wherein the at least one intermediate coupling device may be activated and deactivated via a coupling control signal line. At least two of the intermediate coupling devices may be connected to and controlled by the same coupling control signal line. The values $\alpha$ and N may each be greater than one.

At least one embodiment may be summarized as an array addressable superconducting flux digital-to-analog converter (DAC) structure including a first plurality of DACs addressable by a first column line, each of the DACs in the first plurality of DACs addressable by a respective one of a number of row lines; and at least a second plurality of DACs addressable by a second column line, each of the DACs in the second plurality of DACs addressable by a respective one of the number of row lines, wherein each of the DACs includes a respective plurality of SQUIDS and a pair of current dividers, the current dividers each coupling a respective side of the SQUIDS of the respective DAC.

The array addressable superconducting flux DAC structure may further include a number of bit lines, wherein each of the plurality of SQUIDs that is in the same relative position in each of the first and second plurality of DACs is addressable by a respective one of the number of bit lines.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

Figure 1:
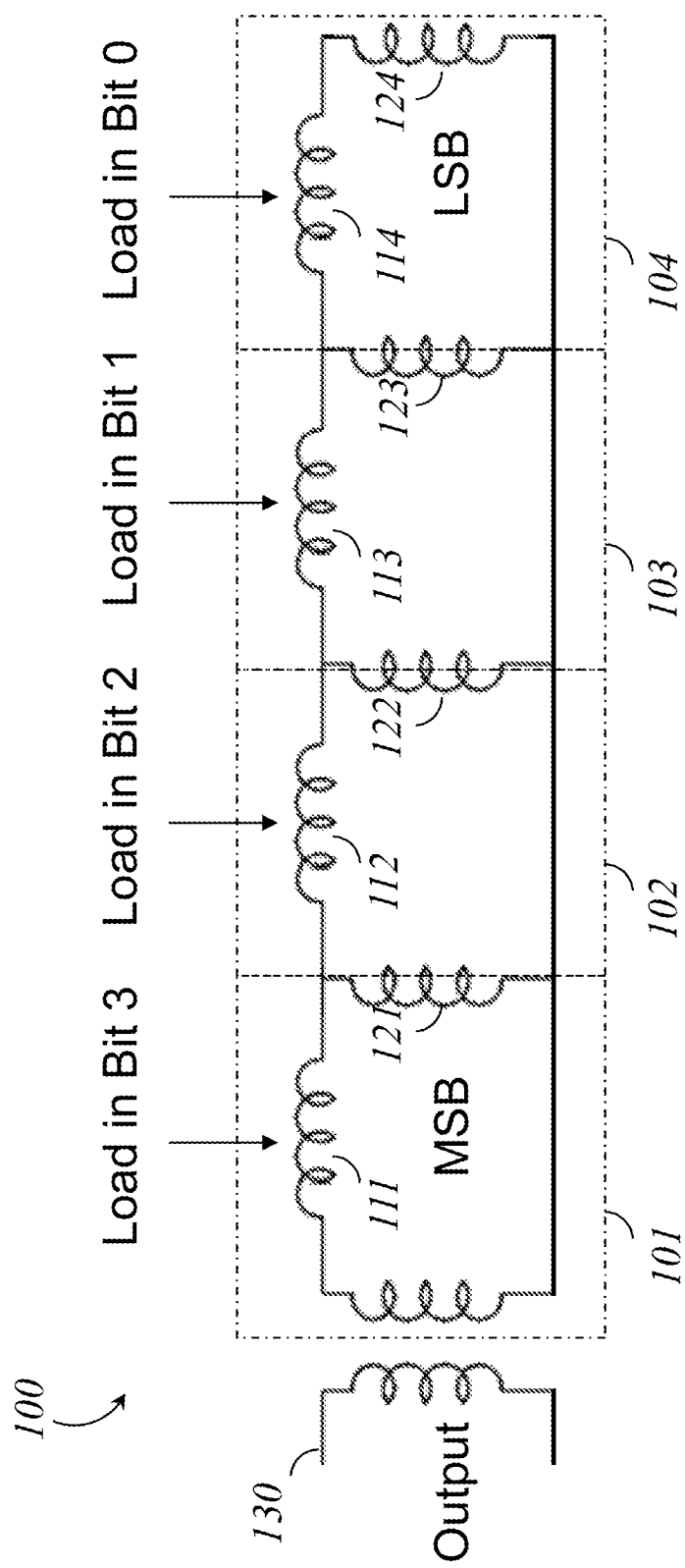
FIG. 1 is a schematic diagram of a superconducting inductor ladder that implements flux-divider circuits.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments. Throughout this specification and the appended claims, the words "element" and "elements" are used to encapsulate, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a", "an", and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Furthermore, certain figures herein depict various voltage and current waveforms. These waveforms are intended to be illustrative for purposes of understanding operation of embodiments, and are not intended to be drawn to scale and/or to precisely and accurately depict waveform behavior in terms of shape, amplitude, duty cycle, frequency, distortion, or other characteristics.

The present systems, methods and apparatus describe several embodiments of superconducting flux-based digital-to-analog converters. While these devices are generally useful in any application in which digital-to-analog conversion in the superconducting regime is desired, these devices are particularly useful in the local programming of the elements of a superconducting processor, such as a superconducting quantum processor. Full descriptions of systems, methods and apparatus for the local programming of the elements of a superconducting quantum processor are described in U.S. patent application Ser. No. 11/950,276.

In classical electrical circuits, a common way to achieve digital-to-analog conversion is through a circuit known as a "resistor ladder" or "R-2R ladder." Such circuits rely on the principles of the "voltage-divider" and are very well established in the art. However, they are not appropriate for use in the superconducting regime. Through certain modifications, as in for example U.S. Pat. No. 5,128,675, the resistor ladder can be made to operate in superconducting circuits. However, resistors in any form of circuit (be it classical or superconducting) inherently dissipate power by generating heat and thus they produce thermal noise. This thermal noise can interfere with other components in a highly sensitive superconducting system such as, for example, a superconducting processor employing quantum devices, such as qubits. A modified resistor ladder is not appropriate for the local programming of superconducting quantum processor elements. Thus, there is a need for a new circuit to achieve digital-to-analog conversion in the superconducting regime without relying on a network of noisy resistors. The various embodiments described herein provide new and/or improved systems, methods and apparatus for achieving digital-to-analog conversion of superconducting signals. Common to each embodiment is the implementation of a novel circuit defined herein as a "superconducting inductor ladder circuit" (or a "ladder"). The various embodiments described herein provide alternative systems, methods and apparatus for administering digital signals to such a ladder and/or administering analog signals from such a ladder.

In most applications where digital-to-analog conversion is desired in a system that implements superconducting circuits, it is practical to perform such conversions at room temperature in classical circuits before sending the signals into the superconducting regime. In contrast, the present systems, methods and apparatus apply where digital-to-analog conversion is desired in the superconducting regime, typically because a form of control circuitry is operated in the superconducting regime. As previously stated, managing a single qubit in a superconducting quantum processor requires control over a number of parameters. Conventionally, this requirement necessitated outside communication (that is, communication from outside of the processor architecture) with individual qubits. However, as such processors incorporate more and more qubits, scaling this system of outside communication is impractical and it may be desirable to replace outside communication with local, or "on-chip" control where signals are processed and administered within the superconducting regime, as described in U.S. patent application Ser. No. 11/950,276. The present systems, methods and apparatus describe superconducting circuits that may be implemented in achieving such local control.

In accordance with the present systems, methods and apparatus, a superconducting inductor ladder circuit ("ladder") functions by receiving a multi-bit digital signal, combining the individual bits of the multi-bit digital signal into an analog signal, and administering the analog signal to, for example, at least one programmable device. The ladder may receive and administer signals in the form of magnetic flux quanta.

FIG. 1 is a schematic diagram of a ladder 100 according to one illustrated embodiment. As drawn, ladder 100 comprises four superconducting loops (indicated by broken line boxes) 101-104, connected in parallel. N-bit digital signals are loaded into ladder 100 such that each of superconducting loops 101-104 receives a respective one of the N bits. For example, ladder 100 may receive a 4-bit digital signal, where superconducting loop 101 receives the most significant bit (MSB) and superconducting loop 104 receives the least significant bit (LSB). In a classical electrical circuit, such digital bits may be represented by voltages. However, in a superconducting circuit, such digital bits may be represented by magnetic flux quanta. Thus, while a classical resistor ladder may implement voltage-divider circuits, ladder 100 implements a superconducting analogue in the form of flux-divider circuits.

Ladder 100 may operate as an intermediate device that converts a data signal from a signal source and administers the converted signal to at least one programmable device. FIG. 1 shows a signal output 130 from ladder 100 on the left-hand side, though those of skill in the art will recognize that this is an arbitrary placement intended for illustrative purposes only. Furthermore, signal output 130 shown in FIG. 1 is through inductive coupling. In other embodiments, the output of ladder 100 may be directly (i.e., galvanically) connected to at least one programmable device, or coupled to at least one programmable device by capacitive coupling. In still other embodiments, the output of ladder 100 may be inductively coupled to an intermediate coupling device which is capable of being activated or deactivated by a control line. In such embodiments, inductive coupling between ladder 100 and a programmable device is realized when the intermediate coupling device is activated by the control line. Also, while ladder 100 is shown in FIG. 1 with four superconducting loops 101-104, those of skill in the art will appreciate that any number of parallel superconducting loops could be used depending on the requirements of the specific system and the resolution of the digital signal being administered. For example, the analog conversion of an 8-bit digital signal may be realized using a ladder with eight superconducting loops connected in parallel.

Returning to the exemplary embodiment shown in FIG. 1, the individual bits of a 4-bit digital signal are each loaded into a respective one of superconducting loops 101-104. However, because superconducting loops 101-104 are connected in parallel, the individual bit signals are consequently shared between adjacent superconducting loops. In this signal-sharing, only a portion of the magnetic flux contained within a given superconducting loop 101-104 is administered to an adjacent superconducting loop. For example, superconducting loop 101 may receive one full magnetic flux quantum as a representation of a single digital bit from a 4-bit digital signal. Superconducting loop 101 may also receive portions of the magnetic flux quanta that are distributed to superconducting loops 102-104 from the other bits of the same 4-bit digital signal. In this case, superconducting loop 101, the most significant bit (MSB), offers the greatest contribution to the analog output 130 because it is immediately adjacent to the analog output 130. It follows that superconducting loop 104, the least significant bit (LSB), offers the smallest contribution because it is the farthest away from superconducting loop 101. In this manner, the discrete magnetic flux quanta that make up a 4-bit digital signal are combined into one analog signal in superconducting loop 101 of ladder 100, from whence they are administered to, for example, a programmable device. Although signal sharing occurs in both directions (that is, distributed among adjacent superconducting loops both to the left and to the right in FIG. 1), since ladder 100 is only coupled to a programmable device through superconducting loop 101 on the left, leftward distributions are most relevant. Those of skill in the art will appreciate that ladder 100 may be coupled to a plurality of programmable devices through a single output point 130 or from different superconducting loops at different points along the length of the entire ladder 100.

As shown in FIG. 1, each superconducting loop 101-104 in ladder 100 contains a serially coupled or "longitudinal" superconducting inductor $L_L$ (111-114) and a parallelly coupled or "transverse" superconducting inductor $L_T$ (121-124). Those of skill in the art will appreciate that an equivalent circuit may substitute any single inductor in ladder 100 with a plurality of inductors connected in series or in parallel, and thus the terms $L_L$ and $L_T$ may be taken to represent the total serial or longitudinal and parallel or transverse inductances, respectively. The degree of signal-sharing among superconducting loops 101-104 is governed by the magnitudes of these inductances. Specifically, the ratios of the magnitudes of the various serial or longitudinal superconducting inductors 111-114 and parallel or transverse superconducting inductors 121-124 influence how a data signal is administered between the superconducting loops 101-104. This ratio-based signal distribution may be achieved in a manner that is similar in some respects to the well-understood administration of non-superconducting data signals throughout a classical resistor ladder circuit. The present systems, methods and apparatus describe how to apply these concepts in the superconducting regime.

In some embodiments, the magnitudes of the inductors in ladder 100 may be selected to facilitate binary encoding. For example, within superconducting loop 102, serial or longitudinal superconducting inductor 112 and parallel or transverse superconducting inductor 122 may be selected such that the ratio of their magnitudes is $$\frac{L_{112}}{L_{122}} \approx \frac{1}{2}.$$

In some embodiments, this ratio is the same for each superconducting loop in the ladder 100. In such embodiments, it may be practical to implement superconducting inductors such that all serial or longitudinal superconducting inductors (111-114) have the same value of inductance $L_L$, and all parallel or transverse superconducting inductors (121-124) have the same value of inductance $L_T$, where $L_T \sim 2L_L$. Such a selection may improve accuracy while simplifying the design and fabrication of the ladder 100 for applications where binary encoding is desired.

Figure 2:
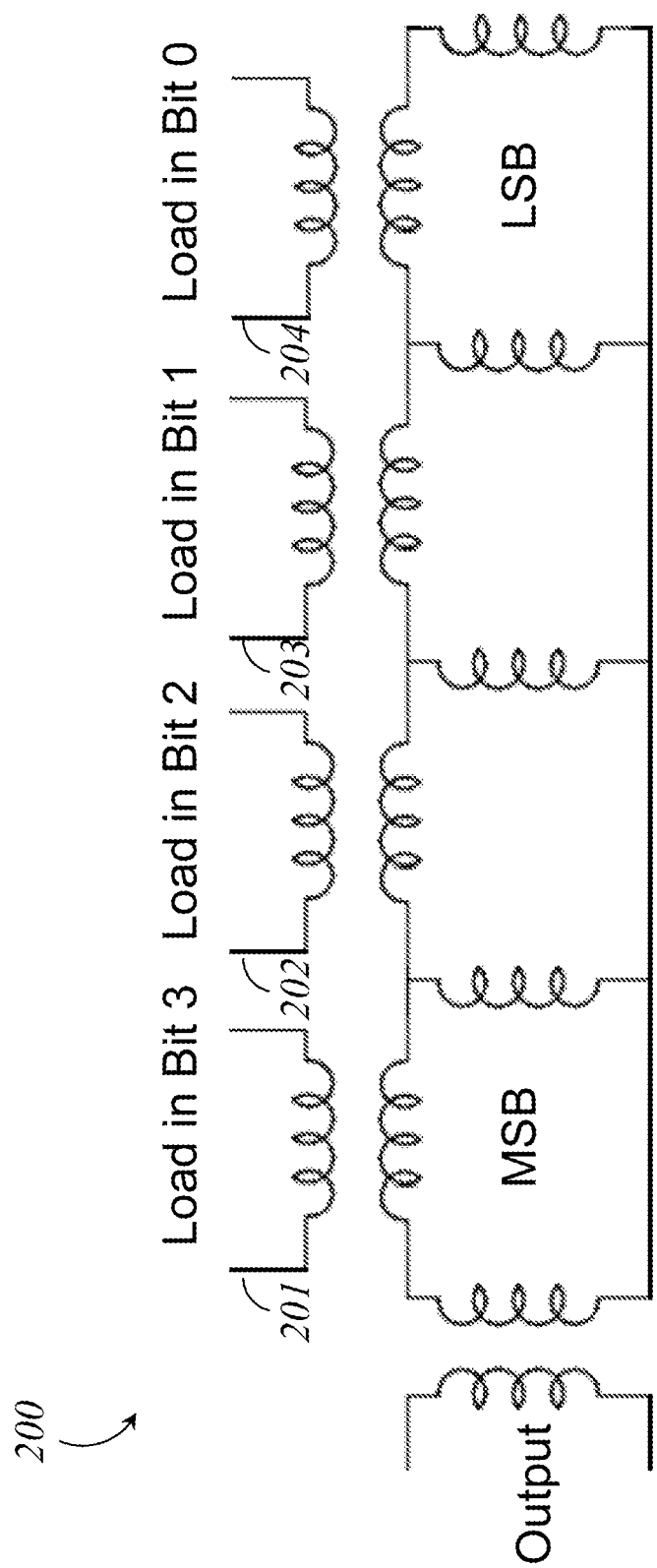
FIG. 2 is a schematic diagram of a superconducting inductor ladder into which N-bit digital signals are loaded by inductive coupling to N signal lines.

A further aspect of the present systems, methods and apparatus is the manner in which magnetic flux signals are loaded into the ladder. In FIG. 1, the loading sites are indicated but the mechanism by which the magnetic flux signals are produced and administered to the circuit is not shown. One method for loading a ladder is shown in FIG. 2. FIG. 2 is a schematic diagram of a ladder 200 that is loaded by inductive coupling to signal input lines 201-204. Each signal input line 201-204 may carry a respective signal embodying a single bit of information. While this arrangement has the benefit of simplicity, at least one signal line is required per bit of information. This amounts to many signal lines when administering high resolution signals. Complications arising from the introduction of many signal lines to the system may be avoided by instead loading the ladder using a more sophisticated technique of data manipulation, such as, for example, a superconducting shift register. In accordance with the present systems, methods and apparatus, alternative structures and techniques for loading superconducting signals into a ladder circuit are described.

Figure 3:
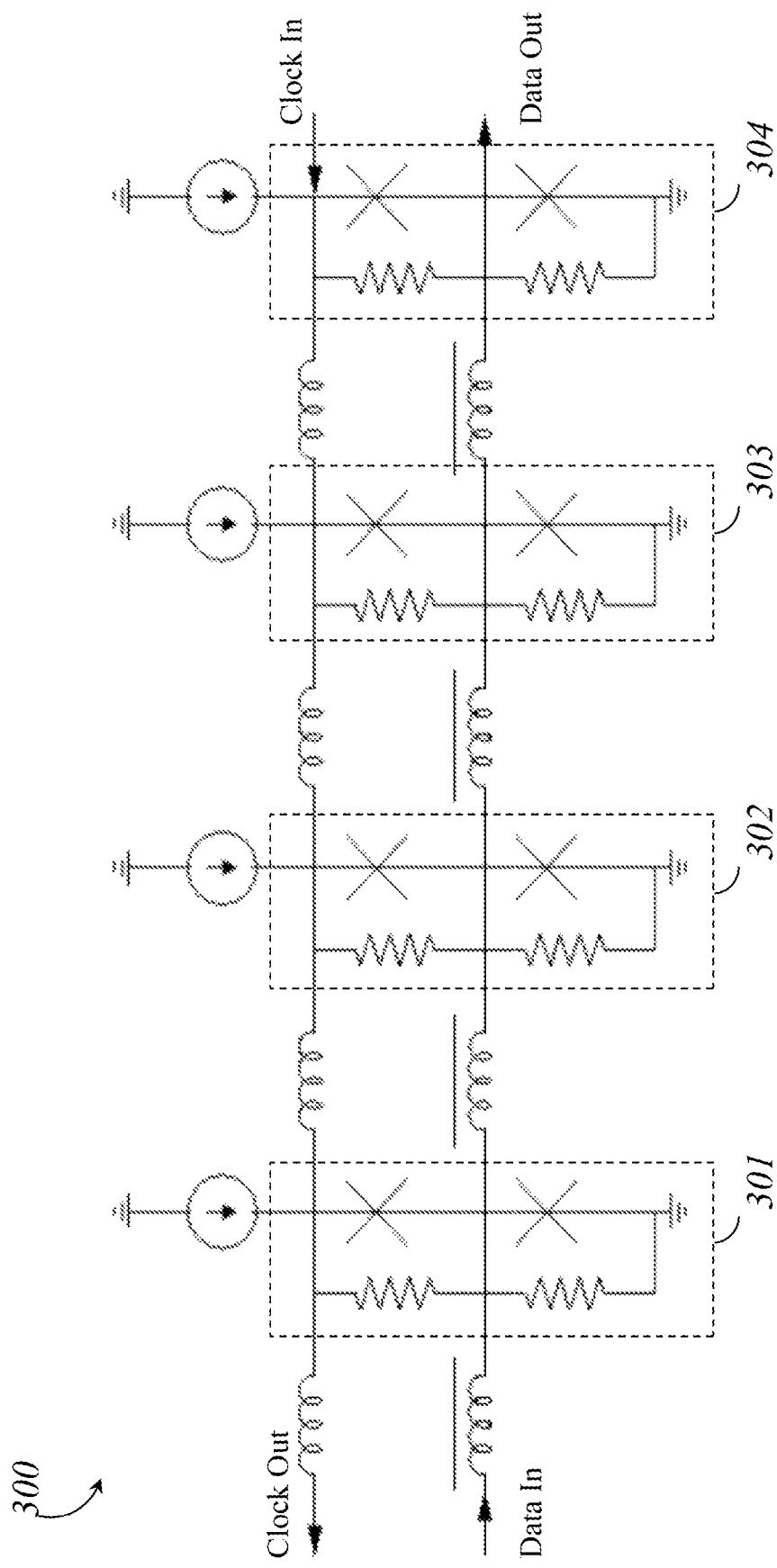
FIG. 3 is a schematic diagram of a single flux quantum (SFQ) shift register.

In some embodiments, communication with a ladder may be achieved by incorporating a superconducting memory register that operates on magnetic flux quanta. A single flux quantum (SFQ) shift register is one such memory register that is well known in the art. FIG. 3 is a schematic diagram of an example SFQ shift register 300. The SFQ shift register 300 is essentially a Josephson transmission line (a superconducting device that is well known in the art) where the propagation of flux along the line is controlled rather than being permitted to flow freely. SFQ shift register 300 comprises four individual superconducting registers 301-304, although any number of individual superconducting registers is possible depending on the system requirements. By controlled application of the data and clock signals, a digital signal is formed in an individual superconducting register and then made to shift along the line sequentially from individual superconducting register to adjacent individual superconducting register. In SFQ shift register 300, the digital signal is represented by discrete magnetic flux quanta. Thus, SFQ shift register 300 may be used to generate a 4-bit binary signal, where each individual superconducting register represents a bit of information. However, in embodiments that permit the realization of multiple magnetic flux quanta within each individual superconducting register, greater signal resolutions may be achieved with fewer individual superconducting registers. A key characteristic of the SFQ shift register is that one set of data and clock signal lines can be used to administer any N-bit signal, and effectively any number of N-bit signals. This may greatly reduce the number of communication conduits required in programming the elements of a superconducting processor and thus enhance the scalability of the system.

Figure 4:
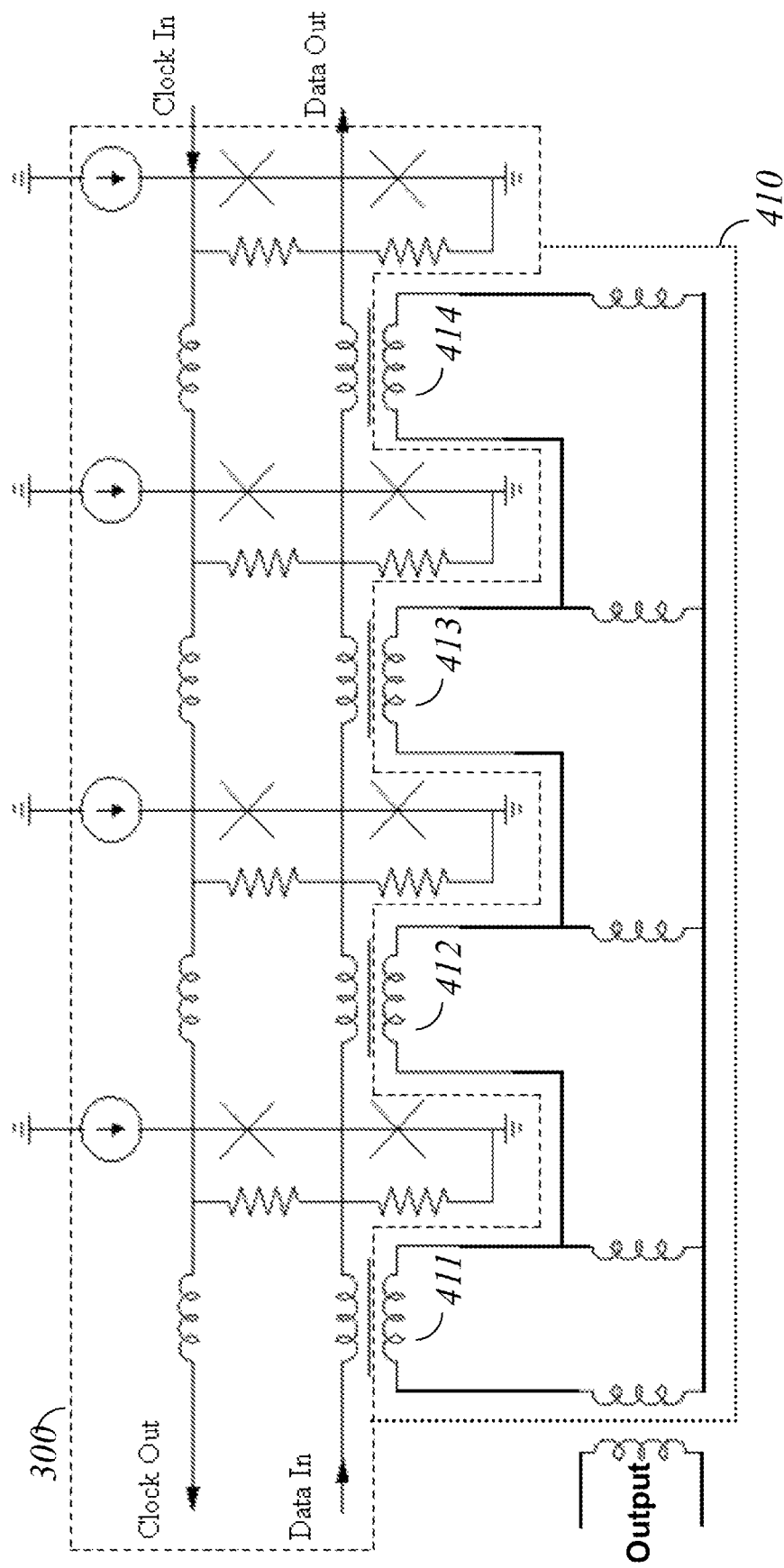
FIG. 4 is a schematic diagram of a superconducting inductor ladder being directly loaded by a SFQ shift register.

SFQ shift register 300 may be used to load signals into a ladder by effectively replacing the inductive coupling to signal input lines 201-204 shown in FIG. 2. FIG. 4 is a schematic diagram of a ladder 410 being directly loaded by an SFQ shift register 300. In this embodiment, each of the longitudinal inductors 411-414 in ladder 410 are inductively coupled to a respective superconducting register in SFQ shift register 300. As SFQ shift register 300 is controlled by only two signal lines (the clock and data lines, as shown in FIG. 4), the number of signal lines required to load a 4-bit signal, or a signal of any resolution, into ladder 410 is only two. Thus, by loading a ladder with a superconducting shift register, the number of external signal lines may be minimized.

As discussed previously, the SFQ shift register may be used to administer flux signals to any spatial layout of a ladder. Furthermore, certain embodiments may program any number of programmable devices by incorporating any number of ladders and SFQ shift registers in whatever spatial arrangement is required to adapt to the spatial constraints of the system and to accommodate the desired number of communication conduits communicating with the external environment. For instance, certain embodiments may incorporate one continuous ladder communicating with one continuous SFQ shift register, where the layout of both devices bends back and forth on itself (for example, similar to a serpentine or "S" pattern or crenulated shape) in order to fit onto a single chip and minimize the number of communication conduits. Such a layout could be used to communicate with any number of programmable devices by inductive coupling, either directly or through an intermediate coupling device, at various points along the continuous layout. Similarly, either the ladder or the SFQ shift register, or both devices, may be incorporated as distinct segments with little or no communication between each segment, where each segment communicates with either one distinct programmable device or a plurality of programmable devices.

Figure 5:
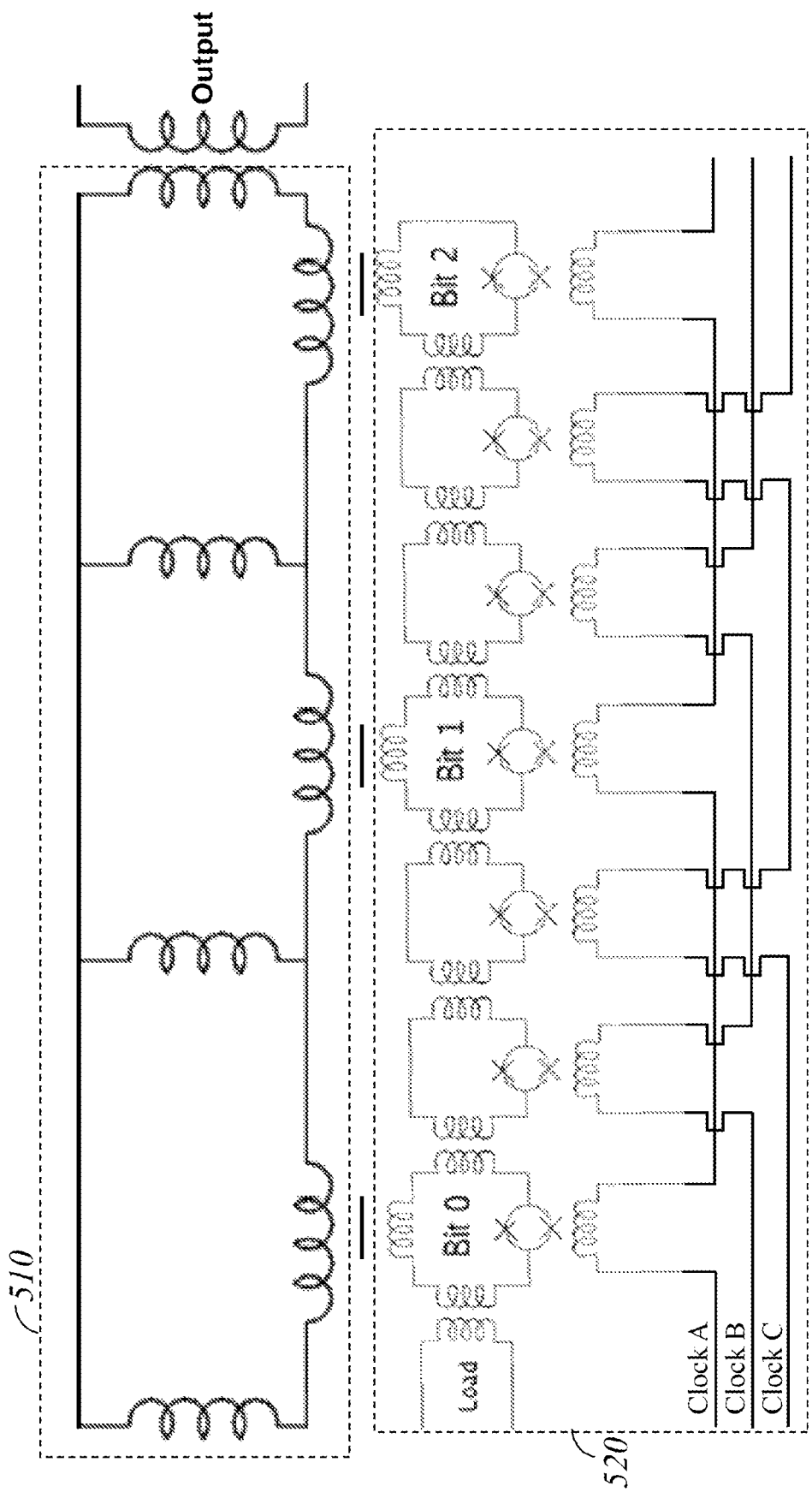
FIG. 5 is a schematic diagram of a superconducting inductor ladder being directly loaded by a flux-based superconducting shift register comprising latching qubits.

In some embodiments, a flux-based superconducting shift register comprised of latching qubits may be used to substitute for the SFQ shift register in some embodiments. Full descriptions of the operation of latching qubits are provided in U.S. patent application Ser. No. 12/109,847. Latching qubits may be used to load digital signals into any form of ladder, including the previously described embodiments of the ladder shown in FIGS. 1, 2 and 4. FIG. 5 is a schematic diagram of a ladder 510 being directly loaded by a flux-based superconducting shift register 520 comprised of latching qubits. In this embodiment, the operation of ladder 510 is as described in for ladder 200 of FIG. 2, except in relation to the mechanism by which the flux data signals are administered to the individual superconducting loops of ladder 510.

The superconducting inductor ladder circuit is a relatively simple circuit that enables a novel mechanism for performing digital-to-analog conversion in the superconducting regime. It may be applied in any system that incorporates superconducting signals where it is desired that the superconducting signals be converted from digital to analog form. The various embodiments described in FIGS. 1, 2, 4 and 5 each use inductive coupling to load the individual bits of an N-bit data signal through the longitudinal superconducting inductors (i.e. inductors 111-114) and into the ladder. However, in certain applications of superconducting digital-to-analog conversion, it may be desired to load the individual bits of an N-bit digital signal into the ladder using an alternative to inductive coupling. This is because inductive coupling may be less than 100% efficient and therefore may inherently result in some signal loss. In some applications, this signal loss may be acceptable. However, in other applications, such as high-precision aspects of superconducting quantum processors, this signal loss may present complications in the calibration and operation of digital-to-analog conversion. The present systems, methods, and apparatus therefore describe a scalable superconducting flux digital-to-analog converter ("DAC") that may be loaded in a variety of different ways that do not result in such signal loss. This is accomplished by generating (or, in certain embodiments, regenerating) the magnetic flux quantum representations of digital signals within the structure of the DAC itself, thereby ensuring that each signal is represented by a whole magnetic flux quantum rather than a partial quantum due to losses. The various embodiments of this scalable superconducting flux DAC implement a ladder circuit similar to that described in FIGS. 1 and 2.

In some embodiments, flux data signals may be established within a DAC itself. This may be achieved by, for example, the simultaneous application of at least two controllable electrical currents. These flux data signals are inherently digital as they are represented by the discrete quantization of magnetic flux. In such embodiments, the digital signals established within the DAC are converted into analog supercurrents and administered to, for example, at least one programmable device.

Figure 6A:
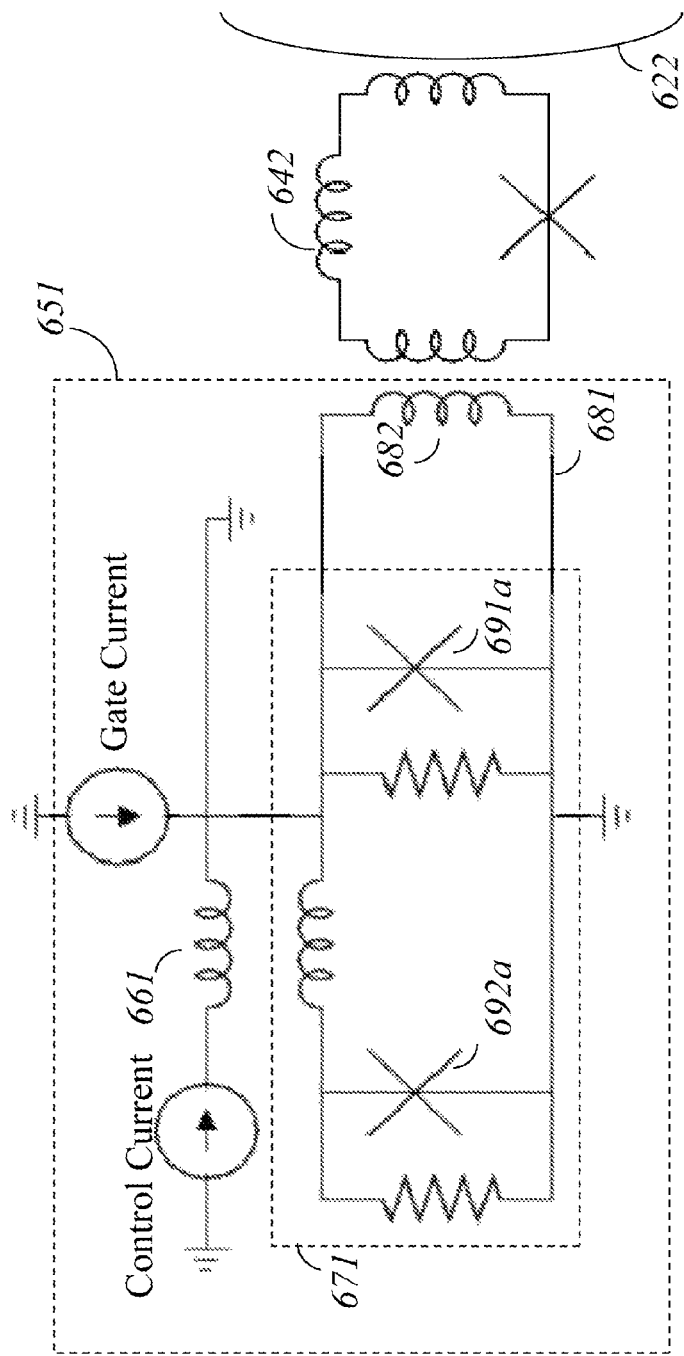
FIG. 6A is a schematic diagram of an embodiment of a single superconducting flux digital-to-analog converter (DAC) unit.

A DAC may include a plurality of structural "units", where the number of units is related to the number of bits of resolution in the digital signal to be converted. FIG. 6A shows a schematic diagram of an embodiment of a single superconducting flux DAC unit 651. In this embodiment, DAC unit 651 is a superconducting device and includes a superconductive quantum interference device (SQUID) 671. SQUID 671 is operated by combining inputs from two controllable electrical currents: the gate current and control current. The gate current may be directly connected to SQUID 671 and the control current may be inductively coupled to SQUID 671 by inductor 661. In FIG. 6A, SQUID 671 is shown with two Josephson junctions, 691a and 692a. However, those of skill in the art will appreciate that a SQUID having a different number or configuration of Josephson junctions may be substituted into DAC unit 651. Superconducting loop 681 is connected in parallel across Josephson junction 691a, and superconducting loop 681 includes a superconducting inductor 682. While superconducting inductor 682 is shown in FIG. 6A as a single device, those of skill in the art will appreciate that superconducting inductor 682 may alternatively comprise a plurality of inductor devices connected in series or in parallel.

Throughout this specification, the terms "forward direction" and "reverse direction" are used to describe the flow of electrical current through certain devices. These terms convey no significance other than to assist in describing the operation of electrical devices. The term "forward direction" is defined as being in the same direction as the indicating arrows in the associated Figure(s), while the term "reverse direction" is defined as being in the opposite direction in the associated Figure(s).

In FIG. 6A, when both the gate current and the control current are applied in the forward direction, the total current flowing through Josephson junction 691a is the sum of the contributions of the gate and control currents, and the total current flowing through Josephson junction 692a is the difference between the contributions of the gate and control currents. Thus, when both the gate current and the control current are applied in the forward direction, the total current flowing through Josephson junction 691a can be made to approach the critical current for that junction. When the critical current is reached, a magnetic flux quantum is realized. At least a portion of this magnetic flux is administered to superconducting loop 681 and stored in superconducting inductor 682. In certain embodiments, at least a portion of the flux stored in superconducting inductor 682 is then administered in the form of an analog supercurrent to, for example, a programmable device 622. In other embodiments, at least a portion of the flux stored in superconducting inductor 682 is administered to an intermediate device 642 through inductive coupling. In such embodiments, at least a portion of the flux stored in superconducting inductor 682 may ultimately be administered to, for example, a programmable device 622 through intermediate device 642.

Figure 6B:
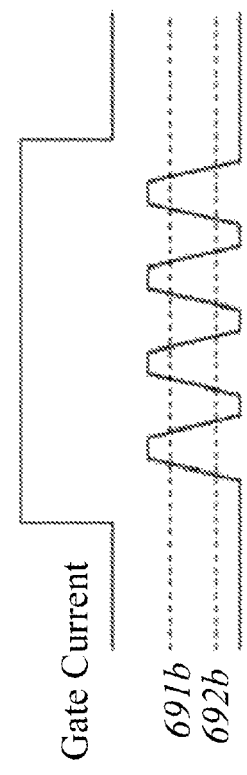
FIG. 6B is an approximate graph representing the gate and control currents input into the superconducting flux DAC unit of FIG. 6A.

In some embodiments, the applied control current may be modulated as depicted in FIG. 6B. FIG. 6B is an approximate graph representing the gate and control currents input into the DAC unit 651 of FIG. 6A. Furthermore, the SQUID inductance may be sufficiently high such that it is capable of realizing multiple magnetic flux quanta. Thus, when both the gate current and the control current are applied in the forward direction, the total current flowing through Josephson junction 691a can be made to approach the critical current of the junction at each peak in the modulated control current. In this manner, a discrete magnetic flux quantum may be realized each time the control current crosses the dashed threshold-line 691b corresponding to junction 691a in FIG. 6B. These multiple flux quanta may be administered to superconducting loop 681, where they are combined and stored in superconducting inductor 682. In certain embodiments, at least a portion of the flux stored in superconducting inductor 682 is then administered to, for example, a programmable device 622 in the form of an analog supercurrent. In other embodiments, at least a portion of the flux stored in superconducting inductor 682 is administered to an intermediate device 642 through inductive coupling. In such embodiments, at least a portion of the flux stored in superconducting inductor 682 may ultimately be administered to, for example, a programmable device 622 through intermediate device 642.

Throughout this specification, certain embodiments are described in which intermediate devices (such as intermediate device 642 in FIG. 6A) are included, and other embodiments are described in which such intermediate devices are not included. Intermediate coupling can be advantageous in systems, such as quantum processors composed of superconducting flux qubits, which are particularly sensitive to magnetic fields in their environment. Though not always necessary, the intermediate coupling device is a means of isolating the quantum processor from these magnetic fields during particular stages in its operation.

As previously described, DAC unit 651 may be capable of realizing multiple magnetic flux quanta. Specifically, the number of magnetic flux quanta n that may be realized by the unit 651 is dependent on the properties of SQUID 671. The characteristics that affect the number of magnetic flux quanta n that may be realized by SQUID 671 are outlined in equation 1 below:

$$n = \frac{LI_c}{\Phi_o} \quad (1)$$

Where

L is the total SQUID inductance;

$I_c$ is the critical current of the Josephson junction; and $\phi_0$ is a fundamental constant known as the magnetic flux quantum.

In theory, DAC unit 651 may be designed to realize any number of magnetic flux quanta n by adjusting the inductance L and the critical current $I_c$ of the system. The number of magnetic flux quanta n that can be administered by the system directly determines the resolution of any digital signal that the DAC unit 651 is capable of administering. An N-bit signal requires $2^N$ units of information, or in this case, $(2^N-1)$ magnetic flux quanta (since "0 flux quanta" is a unit of information). Therefore for DAC unit 651 of FIG. 6A (which comprises only one SQUID), the maximum digital signal resolution is given by $2^N=(n+1)$.

In practice, however, implementing DAC unit 651 into a physical system introduces restrictions on the inductance L and critical current $I_c$. As such, DAC unit 651 has a maximum signal resolution capacity when incorporated into a physical system. Thus, in order to administer signals of higher resolution, a plurality of DAC units may be combined into one DAC structure to administer more individual magnetic flux quanta than physically realizable by a single DAC unit on its own. In such embodiments, the magnetic flux quanta administered by a set of DAC units may be combined into one analog supercurrent, where the contributions from each specific DAC unit may be weighted or scaled by some factor. Throughout this specification, embodiments of superconducting flux DACs which incorporate multiple DAC units are referred to as "weighted DACs."

Figure 7:
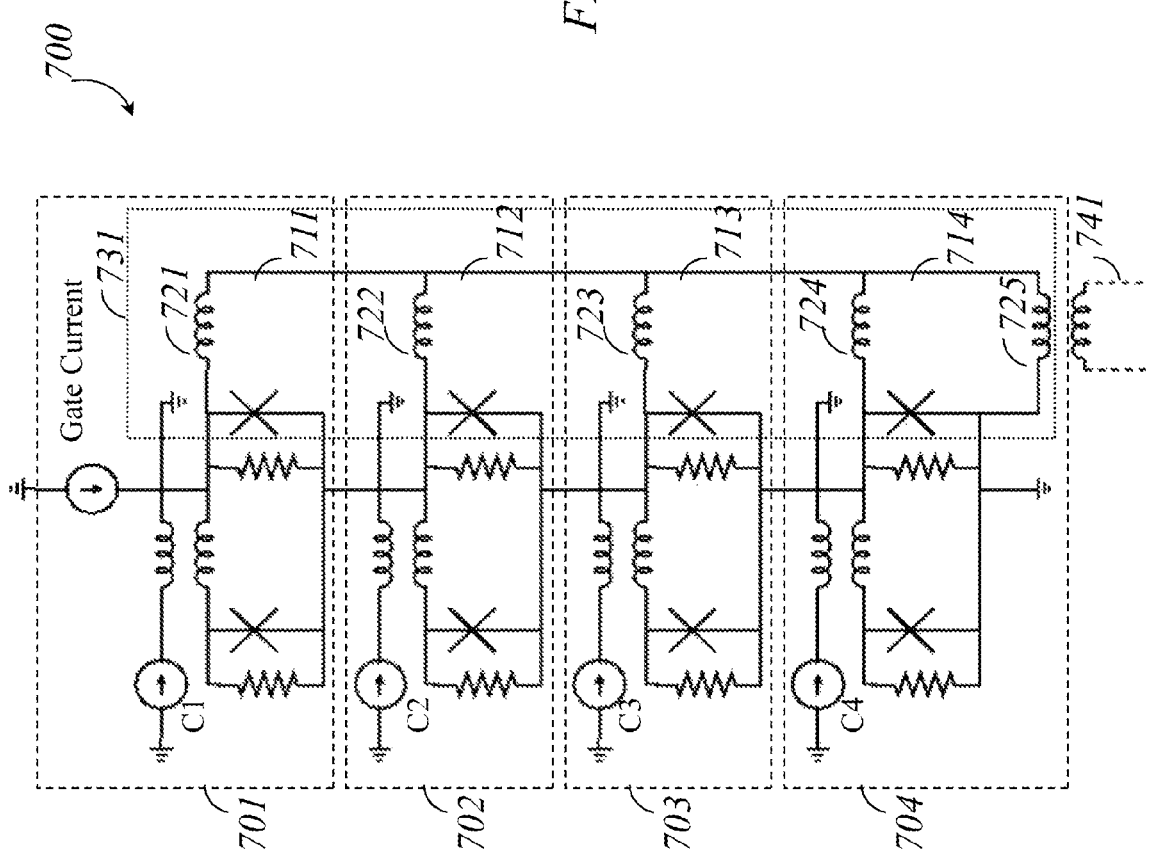
FIG. 7 is a schematic diagram of an embodiment of a columnar weighted superconducting flux DAC that is made up of four individual units arranged in a column.

FIG. 7 is a schematic diagram of an embodiment of a columnar weighted DAC 700 that is made up of four individual DAC units 701-704, arranged in a column. While four individual DAC units are shown for illustration, any number of DAC units may be similarly assembled together, where the number of DAC units in a columnar weighted DAC is related to the resolution of the data signals being administered. For clarity, a columnar layout is used in FIG. 7, however the present systems, methods and apparatus are not so limited in their layout and references to a "column", "columns", or "columnar arrangement" of devices, and similarly references to a "row", "rows", "array", or an "arrayal arrangement" of devices, in this specification and the appended claims do not necessarily limit the layout of the device to such a linear form. Those of skill in the art will appreciate that circuit layouts may be adapted to accommodate any spatial design.

Columnar weighted DAC 700 provides systems, methods and apparatus for loading digital signals into a ladder circuit, similar to ladder 100 of FIG. 1. The ladder circuit of columnar weighted DAC 700 is outlined by dashed lines and called out as 731 in FIG. 7. Similar to ladder 100 of FIG. 1, ladder 731 includes four superconducting loops 711-714 connected in parallel and a set of transverse inductors 721-724, where at least one transverse inductor is shared between adjacent pairs of superconducting loops. For example, inductor 722 is shared between superconducting loops 711 and 712. Ladder 731 differs from ladder 100 in that ladder 731 does not include longitudinal inductors (such as longitudinal inductors 111-114 from ladder 100). This is because ladder 731 receives magnetic flux quanta by direct, galvanic connections to a set of SQUIDs rather than by inductive coupling as in ladder 100.

In columnar weighted DAC 700, flux quanta are established within the DACs themselves. Individual DAC units 701-704 are connected in series by a single gate current input line. Each DAC unit 701-704 has its own inductively-coupled control current input line (C1-C4, respectively) and realizes magnetic flux quanta according to Equation 1. However, in the columnar layout shown in FIG. 7, magnetic flux is also shared between DAC units 701-704 in ladder 731. Each DAC unit 701-704 in columnar weighted DAC 700 functions the same way as DAC unit 651 of FIG. 6A, except for the final distribution of magnetic flux. In the columnar arrangement, flux that enters ladder 731 is sequentially distributed between superconducting inductors 721-724. The distribution between any two adjacent superconducting inductors is determined by the ratio of the magnitudes of their inductances $k_x$ where the subscript x indicates which superconducting inductors are being compared. Thus, if n magnetic flux quanta are realized by DAC unit 701 and distributed to superconducting inductor 721, then roughly $nk_{721,722}$ magnetic flux quanta will be administered to superconducting inductor 722, $nk_{721,722}k_{722,723}$ magnetic flux quanta will be administered to superconducting inductor 723, and $nk_{721,722}k_{722,723}k_{723,724}$ magnetic flux quanta will be administered to superconducting inductor 724. Thus, the total flux that each DAC unit 701-704 contributes to the last superconducting inductor (in this case superconducting inductor 725) is uniquely weighted by the $k_x$ scaling factor(s). In this way, a high resolution digital signal represented by many discrete magnetic flux quanta may be compressed into fractions of quanta, where superconducting loop 714 ultimately contains a flux that is representative of the full resolution signal. This final signal is present in superconducting loop 714 as an analog supercurrent with a magnitude that is weighted by the sequential distribution of discrete magnetic flux quanta through superconducting inductors 721-724. In certain embodiments, the analog supercurrent is coupled to an intermediate device 741 by superconducting inductor 725, from which the signal is transmitted to, for example, a programmable device (not shown). In other embodiments, intermediate device 741 is not required and the analog supercurrent is coupled directly from superconducting inductor 725 to, for example, a programmable device.

In some embodiments of columnar weighted DAC 700, each of individual DAC units 701-704 may be designed to administer a single magnetic flux quantum per cycle. In such cases, magnetic flux quanta can be used to represent any N-bit binary signal by implementing $N = \log_2 n$ individual DAC units in columnar weighted DAC 700. With only one magnetic flux quantum being realized by each SQUID, inductances can be kept quite low, however higher resolution signals demand more and more elaborate layouts consisting of a greater number of individual DAC units.

In other embodiments of the present systems, methods and apparatus, DAC units 701-704 are each used to administer multiple flux quanta per cycle. The exact number of flux quanta that can be realized by each individual DAC unit is still limited by Equation 1, but having n>1 in each DAC unit 701-704 increases the maximum manageable signal resolution without requiring a large number of DAC units in columnar weighted DAC 700. However, inherent to this embodiment is the notion of double counting, whereby magnetic flux quanta realized in two different DAC units can ultimately administer the same weighted quantity of flux to superconducting inductor 725 at the end of ladder 731. That is, in certain embodiments, a given analog supercurrent output from the columnar weighted DAC 700 may be produced by a variety of distinct input signal combinations. This effectively lowers the signal resolution because certain distinct input combinations will produce the same output. Thus, the effective resolution is given by:

$$N = \left(\frac{LI_c}{\Phi_o} + 1\right)^{\alpha} - (DoubleCounts) \tag{2}$$

Where $\alpha$ is the number of individual DAC units in the column (assuming each individual DAC unit 701-704 is designed to administer the same number of magnetic flux quanta). In situations where the signal resolution, after including the effects of double counting, is more than sufficient to produce all unique output signals that are required to fully program the system, then the presence of double counting can be advantageous. In such systems, double counting provides some versatility in programming input signals and allows for some imprecision in the $k_x$ scaling factors, both while maintaining full-range least significant bit values. Furthermore, using distinct input signal combinations to produce the same output signal can be helpful in calibrating the system.

Certain systems may require a greater number of distinct output signals which cannot be attained while double counting effects are present. The effect of double counting could be eliminated if there were no limits on L and $I_c$ in the individual DAC units. However, because these limits do exist in physical systems, double counting effects will always reduce the maximum manageable resolution of the columnar weighted DAC.

In further embodiments of the present systems, methods and apparatus, the ratios $k_x$ of the magnitudes of the inductances of adjacent superconducting inductors in ladder 731 are selected such that no two individual DAC units in columnar weighted DAC 700 ultimately administer the same weighted quantity of flux to superconducting inductor 725 at the end of ladder 731. In such cases, the effects of double counting may be mitigated and a higher effective signal resolution may be obtained, given the limits imposed on each unit inductance L and critical current $I_c$. In one such embodiment, the $k_x$ scaling factors are selected such that less than one full magnetic flux quantum is administered between adjacent transverse or parallel superconducting inductors for any number of input magnetic flux quanta. In other words, $k_x$ may be selected such that:

$$k_x < \frac{\Phi_o}{LI_c} \tag{3}$$

By incorporating individual DAC units that are used to realize multiple magnetic flux quanta, the number X of such DACs required to administer an N-bit signal may be reduced from $X = \log_2 N$ to $X = \log_{(n+1)} N$ where n is the number of flux quanta that can be administered by each individual DAC unit.

In certain embodiments, a superconducting quantum processor may include a plurality of programmable devices, such as but not limited to superconducting flux qubits and tunable couplers. In such embodiments, a plurality of distinct data signals may be administered to the quantum processor in order to individually control the various programmable devices. As stated previously, FIG. 7 shows columnar weighted DAC 700 as being composed of four individual DAC units 701-704, but any number of such individual DAC units may be used as required by the system. Thus, in some embodiments of the present systems, methods and apparatus a single columnar weighted DAC such as columnar weighted DAC 700 may be used to program a plurality of programmable devices. One such embodiment involves inductively coupling, in at least one instance and either directly or through an intermediate coupling device such as intermediate coupling device 642, programmable devices to superconducting inductors in ladder 731. Another such embodiment involves breaking ladder 731 into multiple ladders where each ladder administers a data signal to at least one programmable device via inductive coupling, either directly or through an intermediate coupling device such as intermediate coupling device 642.

In some embodiments, a plurality of superconducting flux DACs, such as columnar weighted DAC 700, may be coupled to a single programmable device. For example, multiple columnar weighted DACs 700 may be coupled to a single superconducting flux qubit, or a single tunable qubit coupler. Having multiple DACs coupled to a single programmable device may allow analog signals to be applied in a substantially continuous waveform, which may be advantageous in certain applications.

Figure 8:
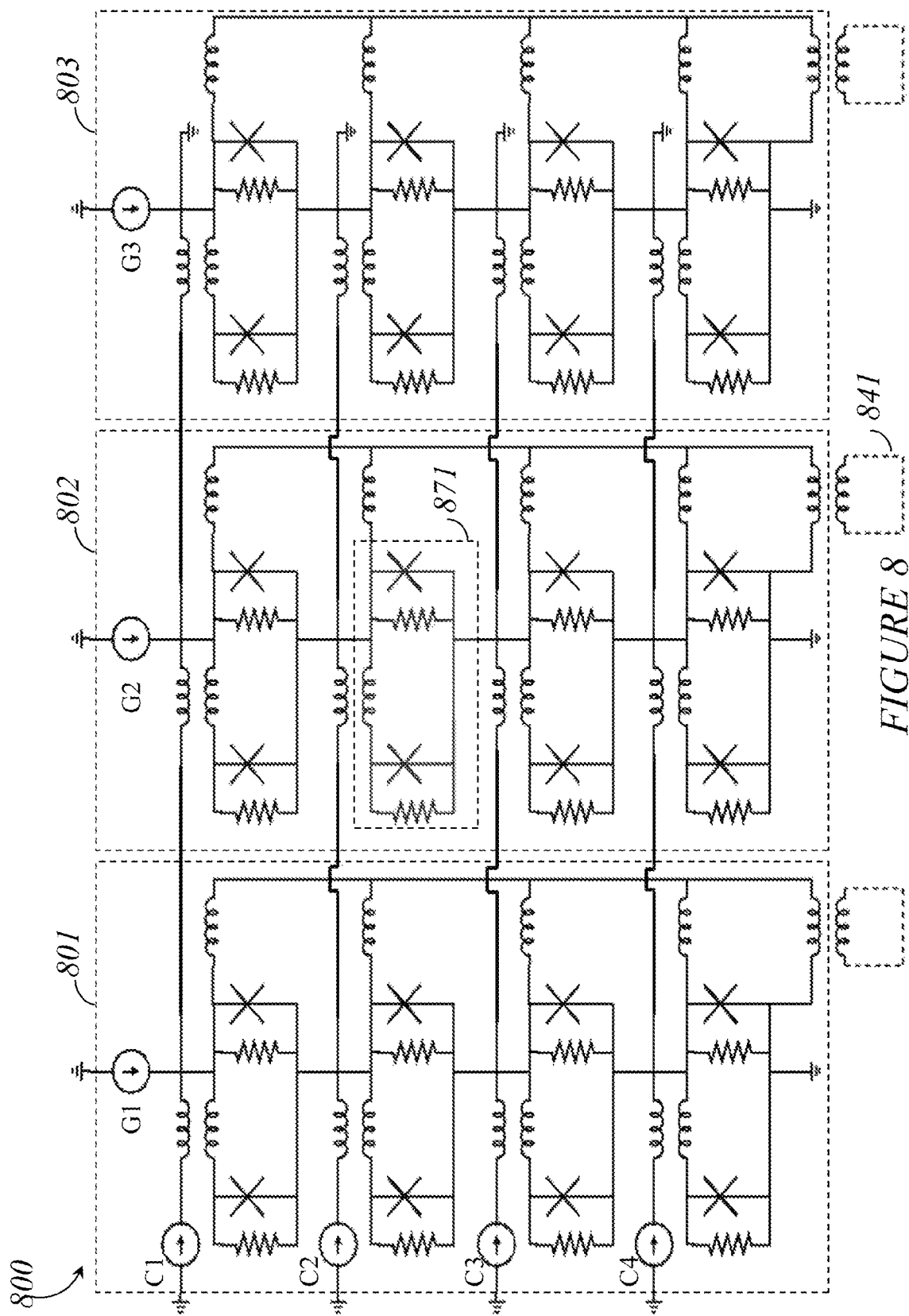
FIG. 8 is a schematic diagram of arrayal weighted superconducting flux DAC that is made up of three columnar weighted superconducting flux DACs, each including four individual units.

In further embodiments of the present systems, methods and apparatus, a weighted arrayal arrangement of individual DAC units may be used to administer data signals to, for example, a plurality of programmable devices. FIG. 8 shows a schematic diagram of arrayal weighted DAC 800 that is made up of three columnar weighted DACs 801-803, each including four individual DAC units (to reduce clutter, the DAC units are not called out in FIG. 8, but each is substantially similar in structure to DAC unit 651 from FIG. 6A). The number of columns, rows, and individual units shown in FIG. 8 represents one possible arrangement of an arrayal weighted DAC, while this specification and the appended claims encompass any number of columns, rows and individual units. Each column in FIG. 8 functions in much the same way as columnar weighted DAC 700 shown in FIG. 7, except that the control current input lines are connected in series across each row in the arrayal weighted DAC 800. Therefore, each individual DAC unit in arrayal weighted DAC 800 is addressable according to its X-Y coordinates in arrayal weighted DAC 800. In arrayal weighted DAC 800, flux quanta are established within the individual DAC units themselves according to deliberate simultaneous application of the gate and control currents that intersect at specific X-Y coordinates For example, magnetic flux quanta may be specifically realized in only SQUID 871 (slightly shaded in FIG. 8 for easier identification) of arrayal weighted DAC 800 by activating gate current G2 in the forward direction and simultaneously applying control current C2 in the forward direction. This realized flux may then be administered through the ladder corresponding to column 802 in arrayal weighted DAC 800, where it is converted into an analog supercurrent according to the $k_x$ scaling factor(s) of successive superconducting inductors as in columnar weighted DAC 700 shown in FIG. 7. The final analog supercurrent is then administered to, for example, a programmable device 841 via inductive coupling, either directly or through an intermediate coupling device such as intermediate coupling device 642.

FIG. 8 is an embodiment of a superconducting flux DAC that uses an arrayal arrangement of twelve individual DAC units laid out in four rows and three columns to administer data signals to, for example, three programmable devices. In some embodiments, there may be more than three programmable devices in the system. In such embodiments, weighted arrayal arrangements of any number of columns, rows, and individual units may be used as required by the system. Furthermore, while FIG. 8 shows a relationship of one column per programmable device, other embodiments may incorporate multiple programmable devices coupled, either directly or through intermediate coupling devices such as intermediate coupling device 642, to various points on a single column in arrayal weighted DAC 800. Such embodiments may be used to minimize the number of communication conduits required to operate the system and thus are advantageous when scalability is an issue. Similarly, in certain applications it may be necessary to couple more than one column to a single programmable device.

For clarity, a linear arrayal layout is used in FIG. 8, however as previously noted the present systems, methods and apparatus are not so limited in layout and references to an "array" or "arrayal arrangement" of devices, and similarly references to a "column", "columns", or "columnar arrangement" and similarly references to a "row" or "rows" of devices, in this specification and the appended claims do not necessarily limit the layout of the device to such a linear form. Those of skill in the art will appreciate that circuit layouts may be adapted to accommodate any spatial design and a superconducting flux DAC can be operated with any number of columns, rows, and individual units as required by the system. Furthermore, some embodiments may include a plurality of independent or electrically isolated columns, rows, or arrays where it is not necessary for each column, row, and array to incorporate the same number of individual DAC units.

As previously discussed, some embodiments of superconducting flux DACs may use memory registers to load data signals into the system, rather than having the flux initially realized by the DAC units themselves. In order to communicate with a superconducting flux DAC, a superconducting memory register that administers magnetic flux quanta is desired. A single flux quantum (SFQ) shift register, such as SFQ shift register 300 shown in FIG. 3, is one such memory register that is well known in the art. Thus, some embodiments of the present systems, methods and apparatus incorporate SFQ shift registers into a superconducting flux DAC for the purposes of realizing and administering the original magnetic flux signals. Those of skill in the art, however, will appreciate that other devices may be used for these purposes, such as latching qubits as disclosed in U.S. patent application Ser. No. 12/109,847.

A memory register may be used in conjunction with a superconducting flux DAC by effectively replacing the control current input line(s), such as control current input lines C1-C4 in FIG. 7 and FIG. 8. Thus, in some embodiments, a memory register may be used to administer flux signals to an individual DAC unit such as DAC unit 651. In other embodiments, a memory register may be used to administer flux signals to a columnar weighted DAC such as columnar weighted DAC 700. In still other embodiments, a memory register may be used to administer flux signals to an arrayal weighted DAC such as arrayal weighted DAC 800.

Figure 9:
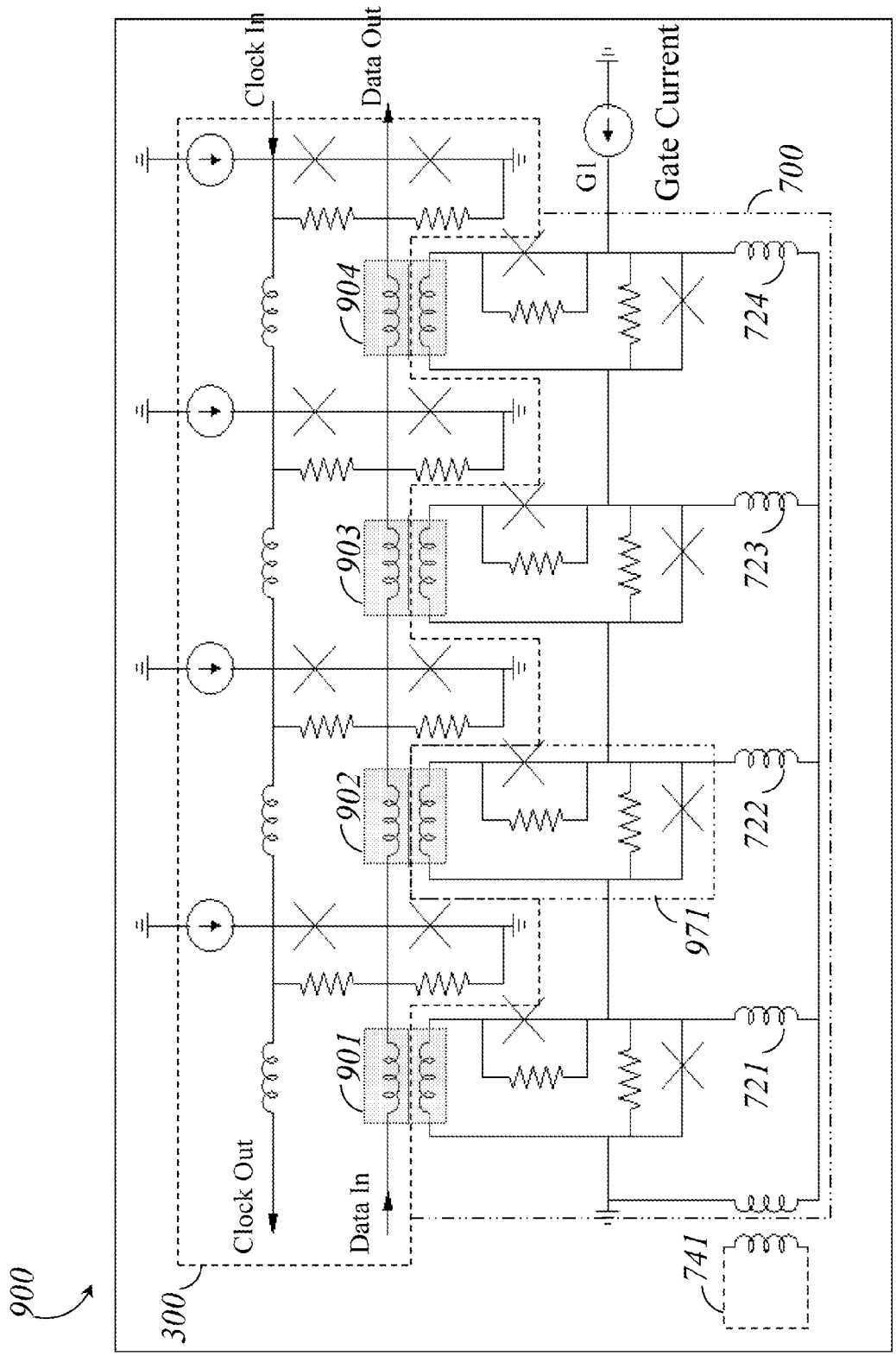
FIG. 9 is a schematic diagram of an embodiment of a system incorporating a columnar weighted superconducting flux DAC to which flux signals are initially administered by a SFQ shift register.

FIG. 9 is a schematic diagram of an embodiment of a system 900 incorporating a columnar weighted DAC 700 to which flux signals are initially administered by a SFQ shift register 300. In order to improve legibility, not all components of FIG. 9 are labeled. FIG. 9 shows columnar weighted DAC 700 rotated clockwise by 90° and inductively coupled to SFQ shift register 300 at four locations (901-904). Control current input lines C1-C4 from FIG. 7 are not required in the embodiment shown in FIG. 9, because in this embodiment the flux signals may be initially realized within SFQ shift register 300 rather than within the individual DAC units themselves.

In the embodiment shown in FIG. 9, the SQUIDs of columnar weighted DAC 700 have a slightly different spatial layout than in the embodiments shown in the other Figures. For example, SQUID 971 shown in FIG. 9 has a spatial layout that is different from SQUIDs 871 and 671 shown in FIGS. 8 and 6A, respectively. However, electrically the SQUID layouts shown in all Figures are equivalent. Those of skill in the art will appreciate that electrical circuit layouts may come in a great variety of spatial forms yet still operate in the same way electrically. The alternative SQUID layout that is shown in FIG. 9 is designed to facilitate communication between columnar weighted DAC 700 and SFQ shift register 300. This communication is realized through inductive coupling at transformers 901-904 (slightly shaded in FIG. 9 for easier identification). Although flux signals are initially realized in the SFQ shift register, SQUIDs (such as SQUID 971) are still used in columnar weighted DAC 700 because, as previously described, the inductive transfer of flux in transformers 901-904 may not be efficient. Thus, in the embodiment shown in FIG. 9, flux signals are initially established in SFQ shift register 300, but these signals are used to regenerate whole flux quanta in the SQUIDs (such as SQUID 971) in columnar weighted DAC 700. By this process, whole flux quanta (rather than partial quanta due to transfer losses) are administered, thereby ensuring consistency in the calibration of the analog supercurrents produced by the columnar weighted DAC. In this embodiment, an N-bit signal may be completely loaded into SFQ shift register 300 while the gate current G1 of columnar weighted DAC 700 is deactivated. Once gate current G1 is activated in the forward direction, the flux signals stored in each individual superconducting register of SFQ shift register 300 are regenerated in the corresponding individual DAC units of columnar weighted DAC 700. The flux signals are then administered to the respective superconducting loops (such as superconducting loops 711-714 in FIG. 7) where they combine in the ladder (such as ladder 731 in FIG. 7) according to their k scaling factors as determined by the relative magnitudes of the superconducting inductors 721-724. This combination produces an analog supercurrent which is then administered to, for example, a programmable device 741 by inductive coupling, either directly of through an intermediate coupling device such as intermediate coupling device 642.

As discussed previously, the SFQ shift register may be used to administer flux signals to any spatial layout of a superconducting flux DAC. Furthermore, certain embodiments may program any number of programmable devices by incorporating any number of superconducting flux DACs and SFQ shift registers in whatever spatial arrangement is required to adapt to the spatial constraints of the system and to accommodate the desired number of communication conduits communicating with the external environment. For instance, certain embodiments may incorporate one continuous columnar weighted DAC communicating with one continuous SFQ shift register, where the layout of both devices bends back and forth on itself (for example, similar to a serpentine or "S" pattern or crenulated shape) in order to fit onto a single chip and minimize the number of communication conduits. Such a layout could be used to communicate with any number of programmable devices by, for example, inductive coupling, either directly or through intermediate coupling devices such as intermediate coupling device 642, at various points along the continuous layout. Similarly, either the superconducting flux DAC or the SFQ shift register, or both devices, may be incorporated as distinct segments with little or no communication between each segment, where each segment communicates with either one distinct programmable device or a plurality of programmable devices.

Figure 10:
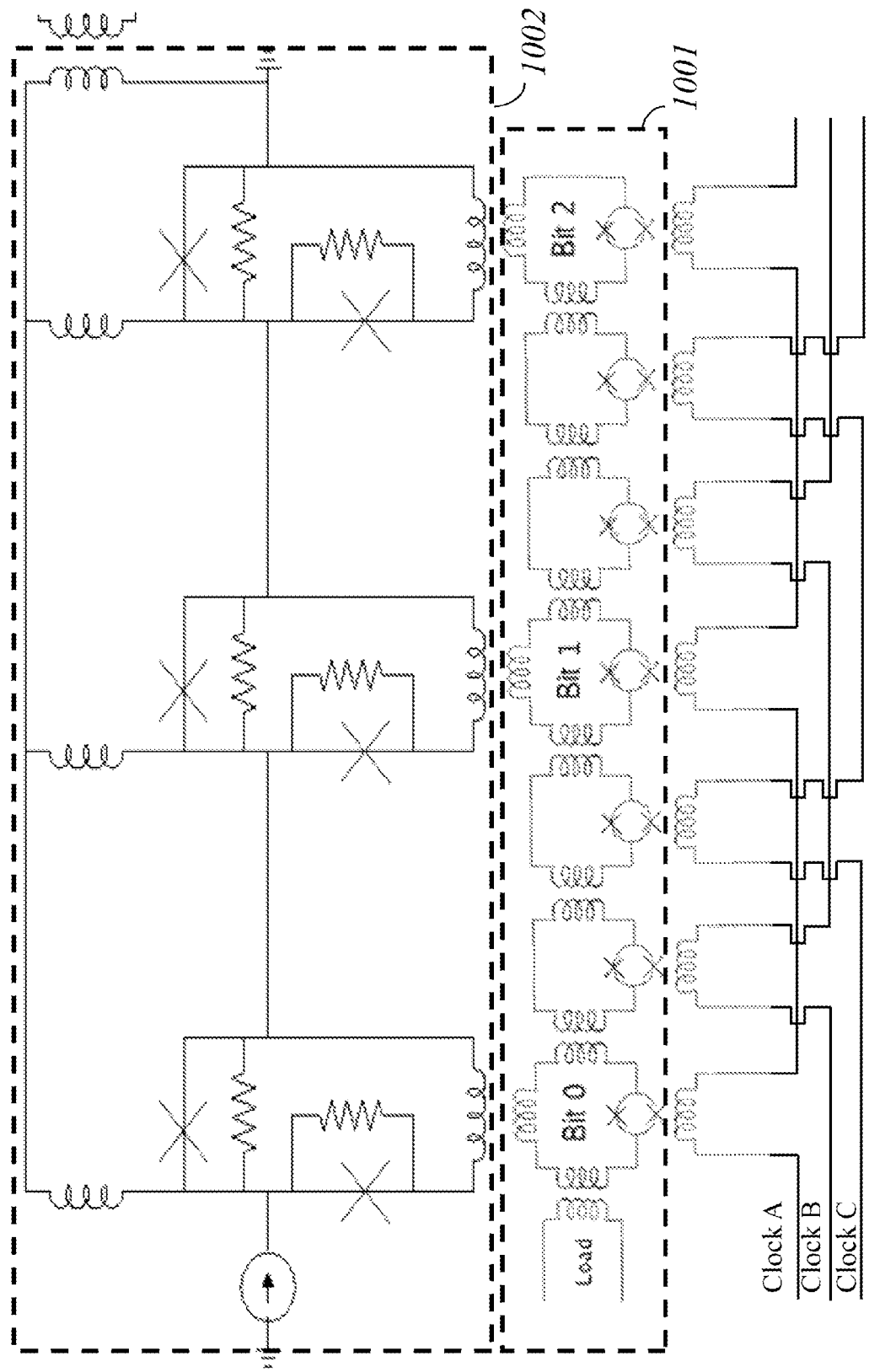
FIG. 10 is a schematic diagram of an embodiment in which latching qubits are used to load flux data signals into a columnar weighted superconducting flux DAC.

As previously discussed, latching qubits may be used to substitute the SFQ shift register in some embodiments. Latching qubits may be used to load digital signals into any form of superconducting flux DAC. FIG. 10 shows a schematic diagram of an embodiment in which latching qubits (collectively 1001) are used to load flux data signals into a columnar weighted DAC 1002. In this embodiment, the operation of the columnar weighted DAC 1002 is substantially similar to that described from columnar weighted DAC 700 in FIG. 9, except in relation to the mechanism by which the flux data signals are administered to columnar weighted DAC 1002. Latching qubits 1001 may be implemented as a flux-based superconducting shift register as described in U.S. Provisional Patent application Ser. No. 60/913,980, filed Apr. 25, 2007 and entitled "ADIABATIC SUPERCONDUCTING QUBIT LOGIC DEVICES AND METHODS" and U.S. patent application Ser. No. 12/109,847.

The embodiments of superconducting flux DACs shown in FIGS. 6-10 may satisfy the requirements of many applications. However, certain characteristics of these DACs may be undesirable in some applications. For instance, in columnar weighted DAC 700, ladder 731 is galvanically coupled to only one side of each respective SQUID in DAC units 701-704. DAC 700 is therefore asymmetrical and, as a consequence, control currents C1-C4 may become highly visible in the analog supercurrent that is output from superconducting inductor 725. Furthermore, because ladder 731 is galvanically coupled to each respective SQUID in DAC units 701-704, the gate current line that connects DAC units 701-704 in series with one another may be affected by the inductances in ladder 731. As a consequence, each of DAC units 701-704 may receive a slightly different gate current signal. This may put each respective SQUID in each of DAC units 701-704 into a different working point and may make it difficult to scale the output analog supercurrent with the input control signals. Thus, while the embodiments of superconducting flux DACs of FIGS. 6-10 may satisfy the requirements of many applications, they can exhibit certain characteristics that may be undesirable in sensitive applications. The present systems, methods and apparatus describe additional embodiments of superconducting flux DACs that may be advantageous in applications that are sensitive to such characteristics.

Figure 11:
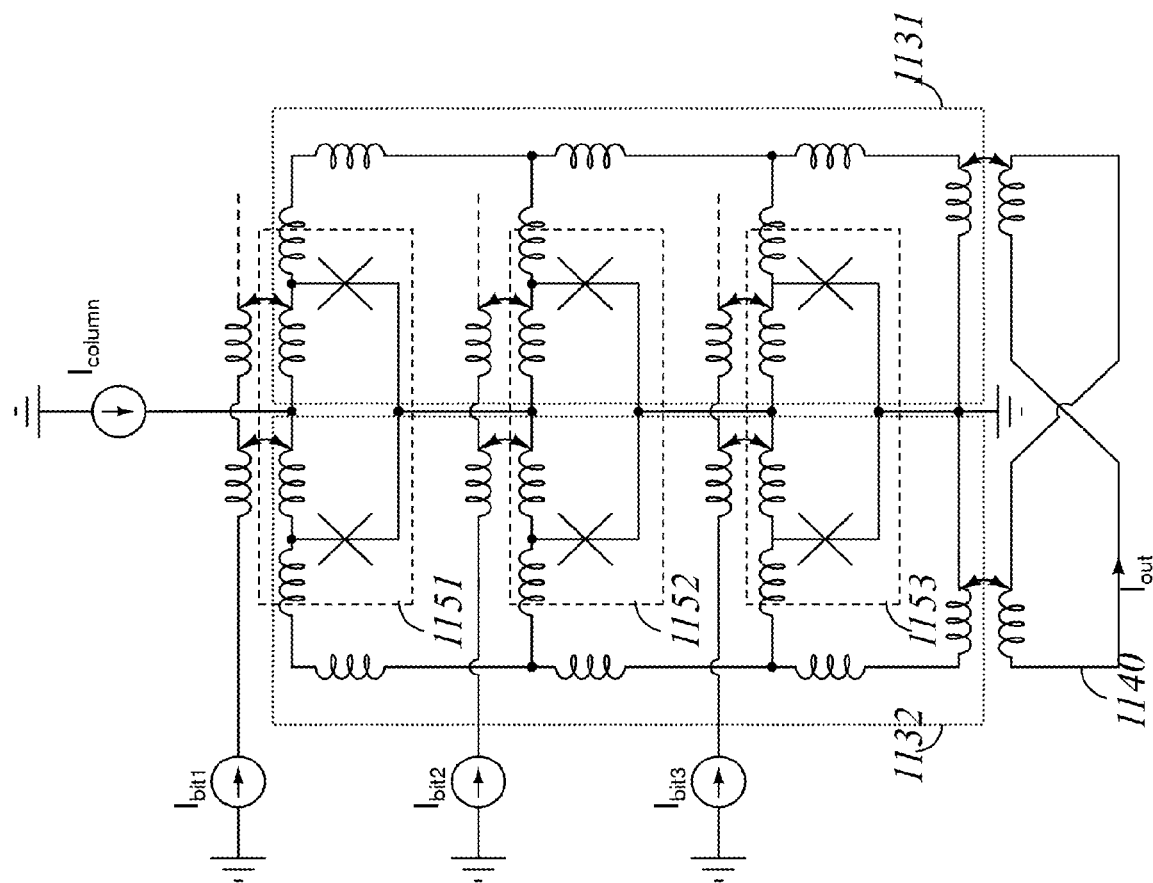
FIG. 11 is a schematic diagram of an embodiment of a symmetrical columnar weighted superconducting flux DAC.

FIG. 11 is a schematic diagram of an embodiment of a symmetrical columnar weighted DAC 1100. DAC 1100 functions in a similar way to DAC 700 from FIG. 7, except that DAC 1100 includes two ladders 1131 and 1132 that capture magnetic flux signals from both sides of SQUIDs 1151-1153. Note that DAC 1100 is illustrated as a column of three serially connected SQUIDs 1151-1153, however any number of SQUIDs may be used depending on the resolution of the digital signals being converted by the DAC. For example, DAC 1100 may convert 3-bit digital signals into analog signals. The second ladder (1132) in DAC 1100 allows DAC 1100 to produce twice the output of DAC 700. Whenever a magnetic flux quantum is administered from a SQUID to a superconducting loop in ladder 1131, a second magnetic flux quantum of opposite sign may be administered from the same SQUID to a superconducting loop in ladder 1132. For example, simultaneous application of the gate current $I_{column}$ and the control current $I_{bit1}$ may be used to produce magnetic flux quanta in SQUID 1151. In this case, a flux quantum of one sign may be output on the right side of SQUID 1151 and captured in ladder 1131 and a flux quantum of opposite sign may be output on the left side of SQUID 1151 and captured in ladder 1132. Both ladders 1131 and 1132 are inductively coupled to a gradiometric transformer 1140 where the magnitudes of the signals output by both ladders 1131 and 1132 are combined to produce double the output signal compared to DAC 700. Furthermore, the control currents that couple into both ladders 1131 and 1132 may be of the same sign, so that when they combine in gradiometric transformer 1140 they are subtracted and cancel each other out. Thus, the control current signals may be less visible in DAC 1100 than in DAC 700. The symmetrical design of DAC 1100 improves its resistance against external magnetic noise sources and helps to localize its own magnetic field, thereby producing less noise to impact any sensitive surrounding circuitry.

Throughout this specification, certain embodiments of the present systems, methods and apparatus are described as being "symmetrical." Those of skill in the art will appreciate that the layout of an electric circuit may be adapted to accommodate the spatial constraints of any system in which it is being implemented. Thus, the term "symmetrical" is used loosely herein to indicate a circuit within which similar operations are performed in similar relative positions on either side of at least one component.

Figure 12:
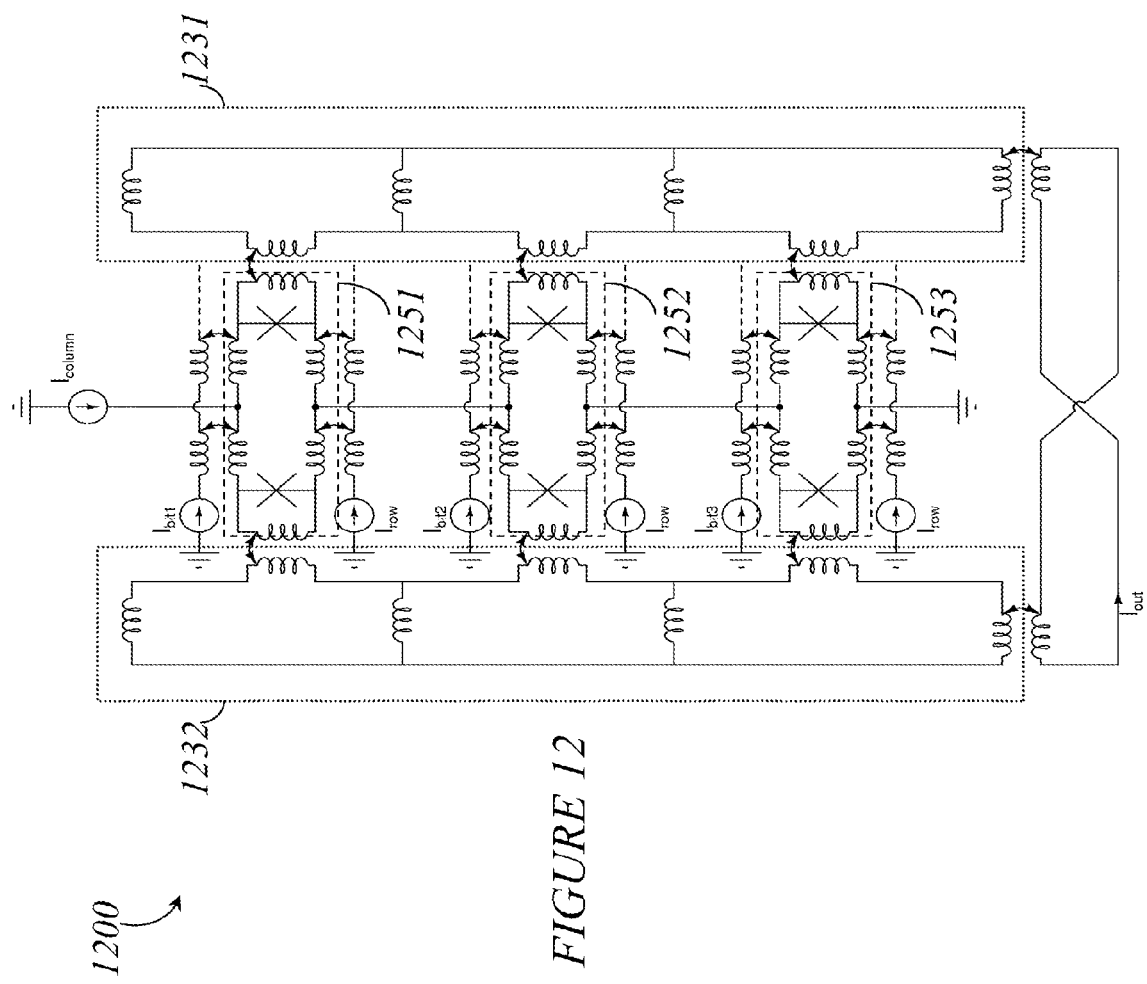
FIG. 12 is a schematic diagram of another embodiment of a symmetrical columnar weighted superconducting flux DAC.

DAC 1100 may be more appropriate than DAC 700 in applications that are sensitive to the effects of the asymmetrical design of DAC 700. However, as previously discussed some applications may be sensitive to the effects of the galvanic coupling between DAC units 701-704 and ladder 731 in DAC 700. FIG. 12 is a schematic diagram of another embodiment of a symmetrical columnar weighted DAC 1200. DAC 1200 functions in a similar way to DAC 1100, except that flux signals are inductively coupled from SQUIDs 1251-1253 through transformers as opposed to being galvanically coupled. The incorporation of inductive transformers (not called out in the Figure to reduce clutter) may be advantageous in some applications, because such inductive coupling allows the gate current signals $I_{column}$ to pass through SQUIDs 1251-1253 without "seeing" the inductances in the superconducting loops of the adjacent ladders. In DAC 1200, $I_{column}$ acts as a true bias current that is substantially the same for each of SQUIDs 1251-1253. Thus, each of SQUIDs 1251-

1253 may operate at approximately the same working point, making it easier to scale the output analog supercurrent with the input control signals.

Figure 13:
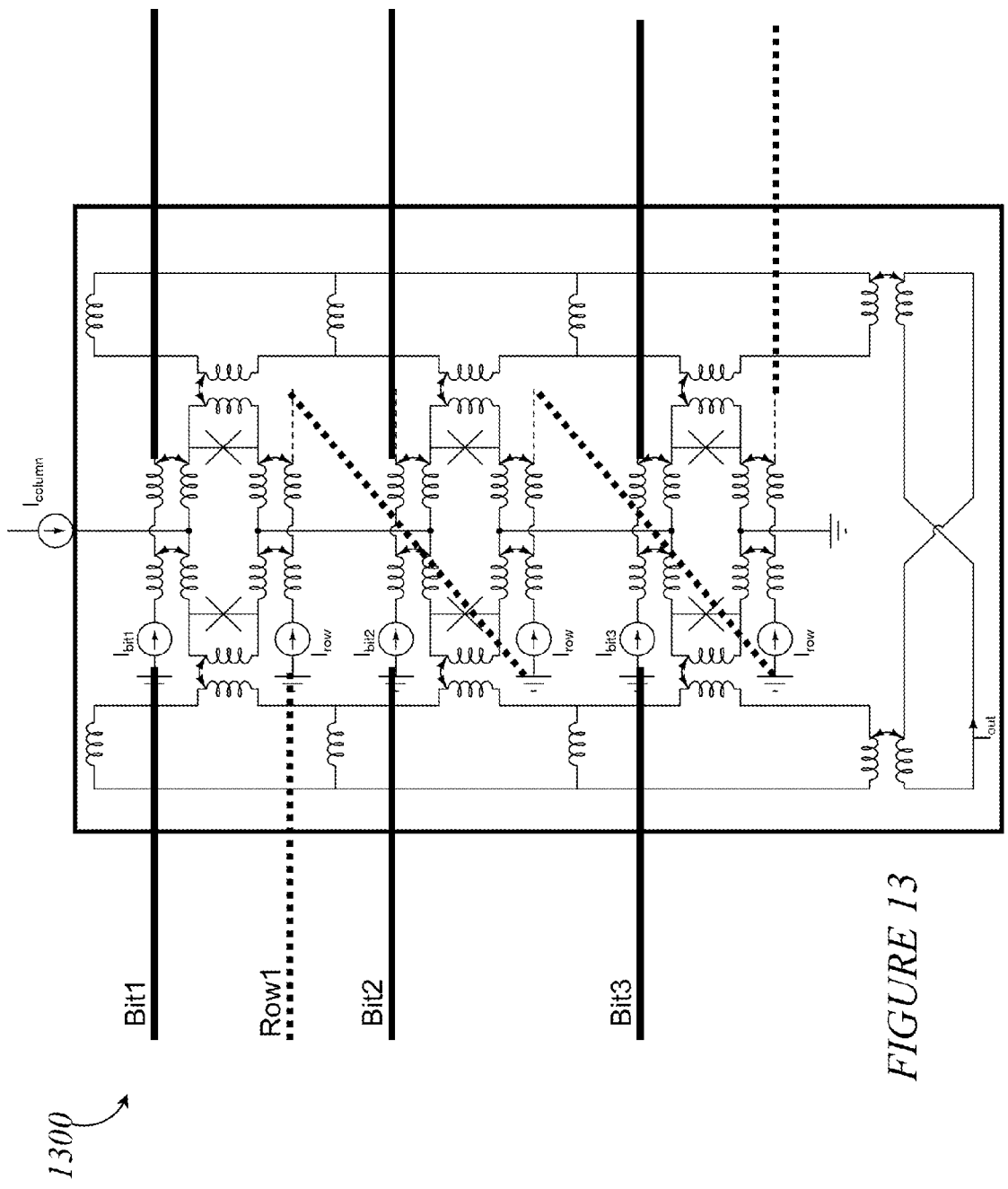
FIG. 13 is a schematic diagram of an embodiment of a symmetrical columnar weighted superconducting flux DAC showing potential paths of the signal lines.

The present systems, methods and apparatus may also be operated in arrayal arrangements. DAC 1200 from FIG. 12 includes an additional signal line, $I_{row}$ for inductively coupling control currents into each of SQUIDs 1251-1253. The same $I_{row}$ signal line may be coupled to each of SQUIDs 1251-1253 respectively. FIG. 13 is a schematic diagram of an embodiment of a symmetrical columnar weighted DAC 1300 showing potential paths of the signal lines Bit1-Bit3 and Row1. DAC 1300 is similar to DAC 1200 except that the signal lines $I_{bit1}$-$I_{bit3}$ from DAC 1200 are renamed Bit1-Bit3 in DAC 1300 and the signal line $I_{row}$ from DAC 1200 is renamed Row1 in DAC 1300. In addition, potential signal paths are made more explicit in DAC 1300. For example, signal lines Bit1-Bit3 are extended by solid lines and the Row1 signal line is represented by a dotted line. In a single columnar arrangement such as that illustrated in FIG. 11 and FIG. 12, the Row1 signal line may be omitted. A single columnar arrangement is well-suited to converting an N-bit digital signal (where the signal resolution N may equal the number of SQUIDs in the column) into an analog signal and coupling that analog signal to, for example, one or many programmable devices. In some embodiments it may be desirable to couple signals to a large number of programmable devices. In such embodiments, a plurality of symmetrical columnar weighted DACs may be operated in an arrayal arrangement where the inclusion of "row-based" signal lines such as $I_{row}$ and Row1 may be advantageous. Embodiments that include a row-based signal line such as $I_{row}$ and Row1 may be adapted such that magnetic flux quanta may be generated by a given SQUID when the Column, Bit, and Row signal lines that are coupled to that SQUID are all applied simultaneously.

Figure 14:
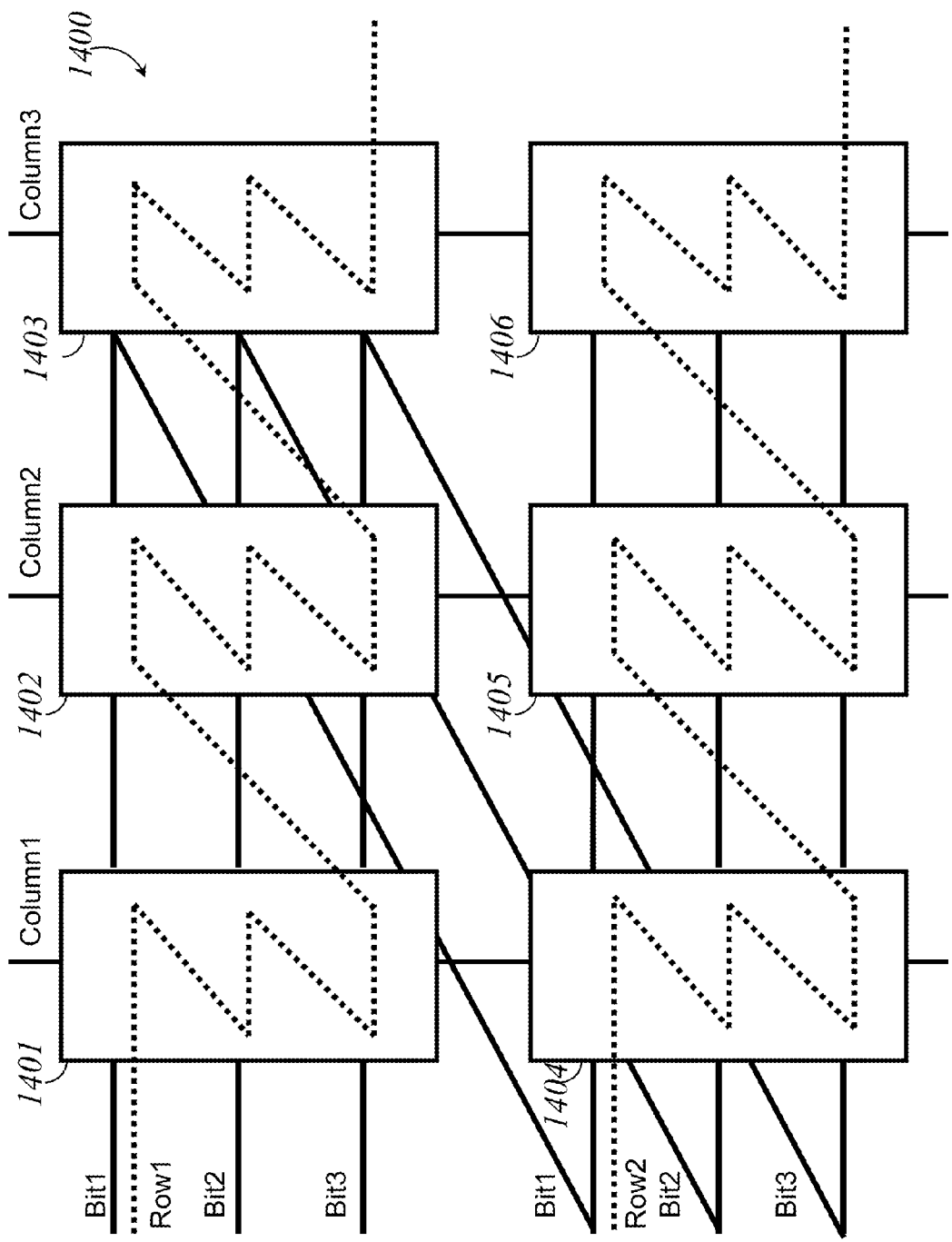
FIG. 14 is a schematic diagram of an embodiment of an arrayal arrangement of six symmetrical columnar weighted superconducting flux DACs.

FIG. 14 is a schematic diagram of an embodiment of an arrayal arrangement 1400 of symmetrical columnar weighted DACs 1401-1406. Each of DACs 1401-1406 may be substantially similar in structure and function to DACs 1200 and 1300 from FIGS. 12 and 13, respectively. The purpose of FIG. 14 is to illustrate the interconnections between the Bit, Row and Column signal paths in arrayal arrangement 1400, and thus DACs 1401-1406 themselves are represented by simplified boxes, where each box contains SQUID, ladder, and gradiometric transformer structures similar to those included in DACs 1200 and 1300. Arrayal arrangement 1400 includes six DACs 1401-1406, however any number of such DACs may be operated in an arrayal arrangement depending on the requirements of the application. In some embodiments, each DAC 1401-1406 is used to couple signals to a single programmable device, or a small number of programmable devices. Thus, applications with many programmable devices may include additional DACs in arrayal arrangement 1400.

Arrayal arrangement 1400 includes two rows and three columns, though any number of rows and columns may be implemented depending on the requirements of the specific application. In some embodiments, all DACs in a given column may be coupled to the same Column signal line. For example, DACs 1401 and 1404 are in the first column in arrayal arrangement 1400 and both DACs 1401 and 1404 are coupled to the Column1 signal line. Similarly, all DACs in a given row may be coupled to the same Row signal line. For example, DACs 1401-1403 are in the first row in arrayal arrangement 1400 and thus DACs 1401-1403 are coupled to the Row1 signal line. The Row1 signal line is represented by a dotted line in FIG. 14 and it is shown to "zig-zag" through each column of DACs 1401-1403. This zig-zag indicates that the Row1 signal line is coupled to each SQUID in each of DACs 1401-1403 as illustrated in DAC 1300 of FIG. 13. Furthermore, in some embodiments all SQUIDs in the same relative position in each of DACs 1401-1406 may be coupled to the same Bit signal line. For example, each of DACs 1401-1406 in arrayal arrangement 1400 includes three SQUIDs, and thus there are three Bit signal lines in arrayal arrangement 1400. The Bit1 signal line is coupled to the topmost SQUID in each of DACs 1401-1406, the Bit2 signal line is coupled to the middle SQUID in each of DACs 1401-1406, and the Bit3 signal lines is coupled to the bottommost SQUID in each of DACs 1401-1406.

The Bit, Row and Column signal line coupling scheme used in arrayal arrangement 1400 reduces the number of signal lines required to program DACs 1401-1406. According to this scheme, the number of signal lines required to program the DACs is N+R+C, where N is the number of bits of resolution in the data signals and R and C are the number of rows and columns in the arrayal arrangement, respectively.

The present systems, methods and apparatus, including but not limited to the embodiments of a scalable superconducting flux DAC described herein, may be operated "in reverse" by switching bias polarity and "subtracting" magnetic flux quanta from the superconducting loops. Such operation may be advantageous in some applications because it may provide a mechanism for unloading or resetting the superconducting flux DAC devices.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other superconducting systems, not necessarily the exemplary superconducting quantum computing systems generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 60/917,884, filed May 14, 2007, entitled "Scalable Superconducting Flux Digital-To-Analog Conversion Using A Superconducting Inductor Ladder Circuit", U.S. Provisional Patent Application Ser. No. 60/917,891, filed May 14, 2007, entitled "Systems, Methods, And Apparatus For A Scalable Superconducting Flux Digital-To-Analog Converter", U.S. Provisional Patent Application Ser. No. 60/975,487, filed Sep. 26, 2007, entitled "Systems, Methods and Apparatus for a Differential Superconducting Flux Digital-to-Analog Converter", U.S. Pat. No. 6,838,694, U.S. Pat. No. 7,335,909, US Patent Publication No. 2006-0225165, U.S. patent application Ser. No. 12/013,192, U.S. Provisional Patent Application Ser. No. 60/986,554 filed Nov. 8, 2007 and entitled "Systems, Devices and Methods for Analog Processing", U.S. Provisional Patent Application Ser. No. 61/039,710, filed Mar. 26, 2008 and entitled "Systems, Devices, And Methods For Analog Processing", US Patent Publication No. 2006-0147154, U.S. patent application Ser. No. 12/017,995, U.S. patent application Ser. No. 11/950,276, and U.S. patent application Ser. No. 12/109,847 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of operation in a local control subsystem for programming the elements of a superconducting programmable device, the method comprising:
for each element being programmed:
encoding the programming of the respective element in at least one digital signal;
generating the at least one digital signal in the form of discrete magnetic flux quanta;
administering the discrete magnetic flux quanta to at least two storage devices;
combining the discrete magnetic flux quanta into an analog signal, wherein the contribution of each magnetic flux quantum is weighted according to the storage device to which it was administered; and
administering the analog signal to the respective element of the superconducting programmable device.

2. The method of claim 1 wherein the superconducting programmable device is a superconducting quantum processor.

3. The method of claim 2 wherein at least one element being programmed comprises a superconducting qubit.

4. The method of claim 1 wherein the analog signal is a supercurrent.

5. The method of claim 1 wherein generating the digital signal in the form of discrete magnetic flux quanta comprises generating discrete magnetic flux quanta via at least one superconducting quantum interference device (SQUID).

6. The method of claim 5 wherein generating the digital signal in the form of discrete magnetic flux quanta comprises generating discrete magnetic flux quanta via at least two SQUIDs, and wherein each SQUID is coupled to a respective storage device.

7. The method of claim 5 wherein generating the digital signal in the form of discrete magnetic flux quanta comprises generating discrete magnetic flux quanta via an addressable superconducting flux digital-to-analog converter (DAC) structure.

8. The method of claim 7 wherein combining the discrete magnetic flux quanta into an analog signal includes combining the discrete magnetic flux quanta via the addressable superconducting flux DAC structure.

9. The method of claim 1 wherein administering the discrete magnetic flux quanta to at least two storage devices comprises administering the discrete magnetic flux quanta to at least two storage devices via inductive coupling.

10. The method of claim 1 wherein each of the at least two storage devices comprises a respective superconducting inductor.

11. The method of claim 1 wherein administering the analog signal to the element of the superconducting programmable device comprises administering the analog signal to the element of the superconducting programmable device via inductive coupling.

12. The method of claim 1, further comprising:
resetting the storage devices by subtracting discrete magnetic flux quanta from the storage devices.

13. A superconducting programmable device comprising:
a plurality of programmable elements; and
an addressable superconducting flux digital-to-analog converter (DAC) structure, the addressable superconducting flux DAC structure comprising:
a first plurality of DACs addressable by a first column line, each of the DACs in the first plurality of DACs addressable by a respective one of a number of bit lines; and
at least a second plurality of DACs addressable by a second column line, each of the DACs in the second plurality of DACs addressable by a respective one of the number of bit lines,
wherein each of the DACs includes at least one respective flux divider network and at least two respective superconducting quantum interference devices (SQUIDs), each of the at least two SQUIDs configured to inductively couple magnetic flux quanta to a respective superconducting inductor in the at least one flux divider network;
wherein each DAC in the addressable superconducting flux DAC structure is configured to administer signals to at least one programmable element in the plurality of programmable elements.

14. The superconducting programmable device of claim 13 wherein the superconducting programmable device is a superconducting processor.

15. The superconducting programmable device of claim 14 wherein the superconducting programmable device is a superconducting quantum processor.

16. The superconducting programmable device of claim 15 wherein the plurality of programmable elements includes at least two superconducting qubits.

17. The superconducting programmable device of claim 16 wherein the at least two superconducting qubits are superconducting flux qubits.

18. The superconducting programmable device of claim 16 wherein the plurality of programmable elements includes at least one tunable qubit coupler.

19. The superconducting programmable device of claim 13 wherein the addressable superconducting flux DAC structure further comprises:
a first row line, wherein a first one of the DACs in the first plurality of DACs is addressable by the first row line and a first one of the DACs in the second plurality of DACs is addressable by the first row line; and
a second row line, wherein a second one of the DACs in the first plurality of DACs is addressable by the second row line and a second one of the DACs in the second plurality of DACs is addressable by the second row line.

* * * * *